(12) United States Patent
Heidari et al.

(10) Patent No.: US 12,025,576 B2
(45) Date of Patent: Jul. 2, 2024

(54) METHOD FOR ASSESSMENT OF PORE-THROAT SIZE DISTRIBUTION AND PERMEABILITY IN POROUS MEDIA

(71) Applicant: BOARD OF REGENTS, THE UNIVERSITY OF TEXAS SYSTEM, Austin, TX (US)

(72) Inventors: Zoya Heidari, Austin, TX (US); Artur Posenato Garcia, Austin, TX (US); Yifu Han, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 653 days.

(21) Appl. No.: 15/734,047

(22) PCT Filed: May 31, 2019

(86) PCT No.: PCT/US2019/034801
§ 371 (c)(1),
(2) Date: Dec. 1, 2020

(87) PCT Pub. No.: WO2019/232299
PCT Pub. Date: Dec. 5, 2019

(65) Prior Publication Data
US 2021/0223192 A1 Jul. 22, 2021

Related U.S. Application Data

(60) Provisional application No. 62/679,536, filed on Jun. 1, 2018.

(51) Int. Cl.
G01V 3/14 (2006.01)
G01N 24/08 (2006.01)
G01R 33/44 (2006.01)

(52) U.S. Cl.
CPC ......... G01N 24/081 (2013.01); G01R 33/448 (2013.01); G01V 3/14 (2013.01)

(58) Field of Classification Search
CPC ...... G01N 24/081; G01R 33/448; G01V 3/14; G06F 18/00
See application file for complete search history.

(56) References Cited

U.S. PATENT DOCUMENTS

2003/0216630 A1    11/2003   Jersey-Willuhn et al.
2012/0275658 A1    11/2012   Hurley et al.
(Continued)

OTHER PUBLICATIONS

Josh et al., Laboratory Characterisation of Shale Properties, 2012, Journal of Petroleum Science and Engineering 88-89, pp. 107-124 (Year: 2012).*

(Continued)

*Primary Examiner* — John E Breene
(74) *Attorney, Agent, or Firm* — Meunier Carlin & Curfman LLC

(57) ABSTRACT

A computerized method and system include (a) estimating parameters that quantify rock fabric features (e.g., tortuosity, effective pore size, throat-size distribution) by joint interpretation of electrical resistivity, dielectric permittivity, and NMR measurements, (b) developing a new workflow for permeability assessment that incorporates the quantified rock fabric parameters, and (c) validating the reliability of the new permeability model in core-scale domain using electrical resistivity, dielectric permittivity, NMR, Mercury Injection Capillary Pressure (MICP), and permeability measurements.

17 Claims, 9 Drawing Sheets

(56) References Cited

U.S. PATENT DOCUMENTS

2014/0055134 A1  2/2014  Fordham et al.
2015/0211144 A1  7/2015  Feng et al.

OTHER PUBLICATIONS

International Search Report and Written Opinion dated Aug. 26, 2019, from International Application No. PCT/US2019/034801, 9 pages.

Gao et al. "Estimating permeability using median pore-throat radius obtained from mercury intrusion porosimetry", J. Geophys. Eng. 10 (2013).

Archie, G.E., 1942, The electrical resistivity log as an aid in determining some reservoir characteristics: *Transactions of the AIME*, 146(01), pp. 54-62, doi:10.2118/942054-G.

Avellaneda, M. and Torquato, S., 1991, Rigorous link between fluid permeability, electrical conductivity, and relaxation times for transport in porous media: *Physics of Fluids A: Fluid Dynamics*, 3(11), pp. 2529-2540, doi:10.1063/1.858194.

Berg, C.F., 2012, Re-examining Archie's law: conductance description by tortuosity and constriction: *Physical Review E*, 86(4), p. 046314, doi:10.1103/PhysRevE.86.046314.

Berg, C.F., 2014, Permeability description by characteristic length, tortuosity, constriction and porosity: *Transport in Porous Media*, 103(3), pp. 381-400, doi:10.1007/s11242-014-0307-6.

Bernabé, Y. and Revil, A., 1995, Pore-scale heterogeneity, energy dissipation and the transport properties of rocks: *Geophysical Research Letters*, 22(12), pp. 1529-1532, doi:10.1029/95gl01 418.

Bitterlich, V.W. and Wobking, H., 1970, Eine method zur direkten bestimmung der sogenannten "geometrischen tortuosit" (A method for the direct determination of geometrical tortuosity): *Zeitschift Für Geophysik*, 36, pp. 607-620. Article in German.(English Summary included in text, p. 3).

Bloembergen, N., Purcell, E.M., and Pound, R.V., 1948, Relaxation effects in nuclear magnetic resonance absorption: *Physical Review*, 73(7), pp. 679-712, doi:10.1103/PhysRev.73.679.

Carman, P.C., 1937, Fluid flow through granular beds: *Trans. Inst. Chem. Eng.*, 15, pp. 150-166.

Chen, S., Georgi, D., Fang, S., Salyer, J., and Shorey, D., 1999, Optimization of NMR logging acquisition and processing: SPE Annual Technical Conference and Exhibition, Houston, Texas, USA, Oct. 3-6, doi:10.2118/56766-ms.

Claverie, M., 2012, Dielectric scanner multifrequency dielectric dispersion service: Schlumberger.

Clennell, M.B., 1997, Tortuosity: a guide through the maze: *Geological Society, London, Special Publications*, 122(1), pp. 299-344, doi:10.1144/gsl.sp.1997.122.01.18.

Coates, G.R., and Dumanoir, J.L., 1974, A new approach to improved log-derived permeability: *The Log Analyst*, 15(1), pp. 17-31.

Coates, G.R., Xiao, L., and Prammer, M.G., 1999, NMR logging: principles and applications: vol. 344, Haliburton Energy Services, Houston, Texas, USA.

Dong, H., 2007, Micro-CT imaging and pore network extraction: PhD dissertation, Imperial College London, UK.

Garcia, A.P. and Heidari, Z., 2016, Quantification of directional pore network connectivity and rock fabric and its application in enhanced assessment of hydrocarbon reserves: SPE Annual Technical Conference and Exhibition, Dubai, UAE, Sep. 26-28, doi:10.2118/181571-ms.

Han, M., Cuadros, J., Suarez, C.A.P., Decoster, E., Faivre, O., Mosse, L., and Seleznev, N., 2012, Continous estimate of cation exchange capacity from log data: a new approach based on dielectric dispersion analysis: SPWLA 53rd Annual Logging Symposium, Cartagena, Colombia, Jun. 16-20.

Han, Y., and Misra, S., 2018, Bakken petroleum system characterization using dielectric-dispersion logs: *Petrophysics*, 59(2), pp. 201-217.

Johnson, D.L., Koplik, J. and Schwartz, L.M., 1986, New pore-size parameter characterizing transport in porous media: *Physical Review Letters*, 57(20), pp. 2564-2567, doi:10.1103/physrevlett.57. 2564.

Katz, A.J. and Thompson, A.H., 1987, Prediction of rock electrical conductivity from mercury injection measurements: *Journal of Geophysical Research*, 92(B1), pp. 599-607, doi:10.1029/jb092ib 01p00599.

Kozeny, J., 1927, Uber kapillare leitung der wasser in boden: *Royal Academy of Science*, Vienna, Proc. Class I, 136, pp. 271-306.

Nelson, P.H., 1994, Permeability-porosity relationships in sedimentary rocks: *The Log Analyst*, 35(3), pp. 38-62.

Osterman, G., Keating, K., Slater, L., and Binley, A., 2015, Comparison and improvement of laboratory SIP and NMR models of permeability: *85th SEG Annual International Meeting*, SEG Technical Program Expanded Abstracts, pp. 5005-5010, doi:10.1190/segam2015-5906134.1.

Oyewole, E., Garcia, A.P., and Heidari, Z., 2016, A new method for assessment of directional permeability and conducting pore network using electric conductance in porous media: SPWLA 57th Annual Logging Symposium, Reyjavik, Iceland, Jun. 25-29.

Pollock, D.W., 1988, Semianalytical computation of path lines for finite-difference models: *Ground Water*, 26(6), pp. 743-750, doi:10.1111/j.1745-6584.1988.tb00425.x.

Purba, S.A., Garcia, A.P., and Heidari, Z., 2017, New method for rock classification in carbonate formations using well-log-based rock fabric quantification: SPWLA 58th Annual Logging Symposium, Oklahoma City, Oklahoma, USA, Jun. 17-21.

Revil, A. and Cathles, L.M., 1999, Permeability of shaly sands: *Water Resources Research*, 35(3), pp. 651-662, doi:10.1029/98wr02700.

Revil, A. and Florsch, N., 2010, Determination of permeability from spectral induced polarization in granular media: *Geophysical Journal Interpretation*, 181(3), pp. 1480-1498, doi:10.1111/j.1365-246x. 2010.04573.x.

Schindelin, J., Arganda-Carreras, I., Frise, E. et al., 2012, Fiji: an open-source platform for biological-image analysis: *Nature Methods*, 9(7), pp. 676-682, doi:10.1038/nmeth.2019.

Senturia, S.D. and Robinson, J.D., 1970, Nuclear spin-lattice relaxation of liquids confined in porous solids: *Society of Petroleum Engineers Journal*, 10(03), pp. 237-244, doi:10.2118/2870-pa.

Stogryn, A., 1971, Equations for calculating the dielectric constant of saline water (correspondence): *IEEE Transactions on Microwave Theory and Techniques*, 19(8), pp. 733-736, doi:10.1109/tmtt. 1971. 1127617.

Talabi, O.A., 2008, Pore-scale simulation of NMR response in porous media: PhD Dissertation, Imperial College London, UK.

Timur, A., 1968, An investigation of permeability, porosity, and residual water saturation relationships for sandstone reservoirs: SPWLA 9th Annual Logging Symposium, New Orleans, Louisiana, USA.

Tixier, M.P, 1949, Evaluation of permeability from electric-log resistivity gradients: *Oil & Gas Journal*, 16, pp. 113-133.

Weller, A., Nordsiek, S., and Debschütz, W., 2010, Estimating permeability of sandstone samples by nuclear magnetic resonance and spectral-induced polarization: *Geophysics*, 75(6), pp. E215-E226, doi:10.1190/1.3507304.

Wyllie, M.R.J. and Rose, W.D., 1950, Some theoretical considerations related to the quantitative evaluation of the physical characteristics of reservoir rock from electrical log data: *Journal of Petroleum Technology*, 2(04), pp. 105-118, doi:10.2118/950105-g.

Wyllie, M.R.J. and Spangler, M.B., 1952, Application of electrical resistivity measurements to problem of fluid in porous media: *AAPG Bulletin*, 36(2), pp. 359-403, doi:10.1306/3d934403-16b1-11d7-8645000102c 1865d.

Zhang, X. and Knackstedt, M.A., 1995, Direct simulation of electrical and hydraulic tortuosity in porous solids: *Geophysical Research Letters*, 22(17), pp. 2333-2336, doi:10.1029/95GL02230.

Ziarani, A.S. and Aguilera, R., 2012, Pore-throat radius and tortuosity estimation from formation resistivity data for tight-gas sandstone reservoirs: *Journal of Applied Geophysics*, 83, pp. 65-73, doi:10. 1016/j.jappgeo. 2012.05.008.

\* cited by examiner

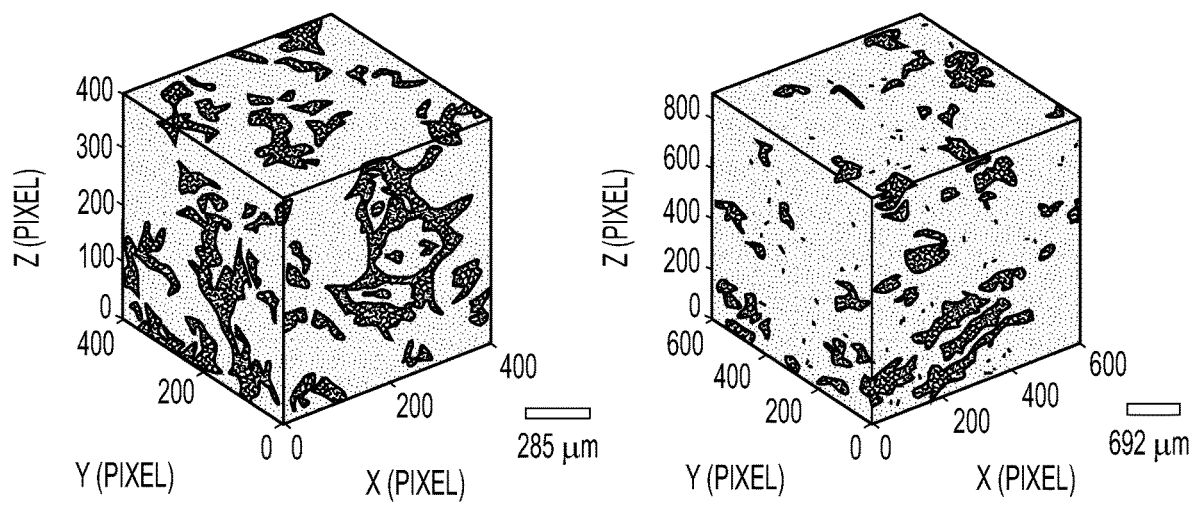
FIG. 7A  FIG. 7B
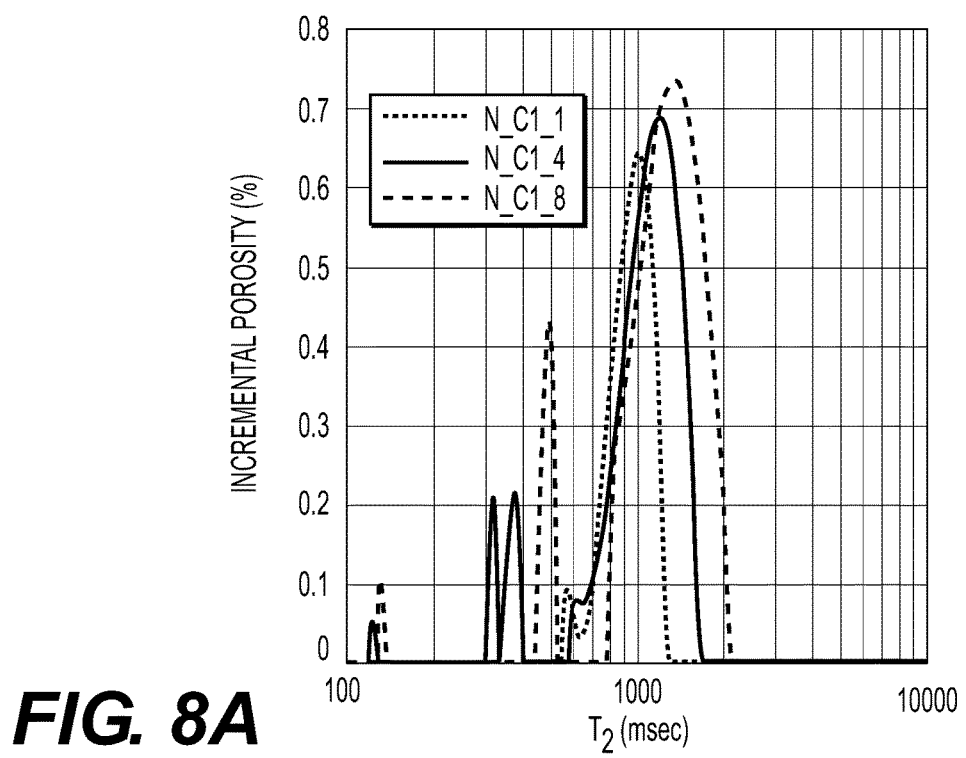
FIG. 8A

METHOD FOR ASSESSMENT OF PORE-THROAT SIZE DISTRIBUTION AND PERMEABILITY IN POROUS MEDIA

CROSS REFERENCE TO RELATED APPLICATIONS

This application claims priority to and incorporates entirely by reference International Patent Application Serial No. PCT/US2019/034801 filed on May 31, 2019, and further claims priority to and incorporates by reference U.S. Provisional Patent Application Ser. No. 62/679,536 filed on Jun. 1, 2018.

BACKGROUND

Variable depositional cycles and severe diagenesis are among the main contributing factors to the complex pore network encountered in porous media formations such as carbonates. This complexity is often not taken into account reliably in conventional models for permeability assessment. Conventional methods for permeability assessment, including electrical-based models (e.g., Katz and Thompson) and Nuclear Magnetic Resonance (NMR)-based models (e.g., Coates and Schlumberger-Doll-Research), either require pore-scale characterization of pore network or extensive calibration efforts such as detection of cutoff values and assessment of constant model parameters.

A need continues to exist in the art of pore network analysis for a joint evaluation of dielectric permittivity, resistivity, and NMR measurements that enable capturing pore-network connectivity, tortuosity, and throat-size distribution for real-time and reliable permeability evaluation, which significantly improves permeability assessment. Such joint interpretation enables taking into account pore structure in assessment of permeability.

BRIEF SUMMARY

Non-limiting embodiments of this disclosure include (a) estimating parameters that quantify rock fabric features (e.g., tortuosity, effective pore size, throat-size distribution) by joint interpretation of electrical resistivity, dielectric permittivity, and NMR measurements, (b) developing a new workflow for permeability assessment that incorporates the quantified rock fabric parameters, and (c) validating the reliability of the new permeability model in core-scale domain using electrical resistivity, dielectric permittivity, NMR, Mercury Injection Capillary Pressure (MICP), and permeability measurements. To achieve the aforementioned objectives, this disclosure introduces a workflow to estimate rock fabric properties as inputs for permeability assessment. NMR measurements will be used to estimate the porosity and the effective pore size. Dielectric permittivity and resistivity measurements to estimate tortuosity constriction factor. Calculating the pore-throat-size distribution from the estimated constriction factor and effective pore size then follow. Finally, the aforementioned quantitative rock fabric parameters will be used to estimate permeability without core-based or image-based calibration efforts.

Examples in the following text illustrate successful validation of the introduced workflow on five core-scale samples from different lithofacies taken from three carbonate formations. Estimates of pore-throat radius obtained from the new method were in agreement with those from MICP measurements. The disclosure explains the use of estimated pore- and pore-throat radii, tortuosity, and constriction factor for quantification of rock fabric in reliable permeability assessment. The proposed workflow significantly reduced the relative error in permeability estimates by 92%, compared to the conventional permeability models (i.e., calibrated porosity-permeability correlations). Furthermore, the new method eliminates the need for cutoffs and excessive calibration efforts in permeability assessment by honoring and quantifying rock fabric.

In a first claimed embodiment, a computerized method of estimating pore-throat-size distribution in a section of porous media includes:
  storing, in computerized memory, measurements performed on the section of the porous media, wherein the measurements comprise (i) nuclear magnetic resonance (NMR) data comprising transverse magnetization decay values (T2), (ii) at least one dielectric permittivity measurement (E), and (iii) at least one directional electrical conductivity measurement (a);
  using a processor to implement software stored in computerized memory, wherein the software is configured to independently calculate the effective pore-throat size from rock fabric parameters, comprising (a) electric tortuosity ($\tau E$) calculated from the dielectric permittivity and the NMR data which correlates to hydraulic tortuosity ($\tau H$), (b) an electrical constriction factor (CE) from the measurements (i)-(iii) which correlates to hydraulic constriction factor (CH), and (c) pore-size distribution (rP) and effective pore radii ($\langle rP \rangle$) calculated from the NMR data;
  wherein the software is further configured to calculate the pore-throat-size distribution (rT) according to the formula:

$$r_T = \frac{r_P}{\sqrt{C_H}}.$$

In another embodiment, a computerized method of estimating directional permeability (k) of a section of a porous media that is either fully or partially saturated with water, includes:
  storing, in computerized memory, measurements performed on the section of the porous media, wherein the measurements comprise (i) nuclear magnetic resonance (NMR) data comprising transverse magnetization decay values (T2), (ii) at least one dielectric permittivity measurement (E), (iii) at least one directional electrical conductivity measurement (a);
  using a processor to implement software stored in computerized memory, wherein the software is configured to independently calculate the directional permeability from fabric parameters comprising (a) electric tortuosity ($\tau E$) calculated from the dielectric permittivity and the NMR data which correlates to hydraulic tortuosity ($\tau H$), (b) an electrical constriction factor (CE) from the measurements (i)-(iii) which correlates to hydraulic constriction factor (CH), and (c) pore-size distribution (rP) and effective pore radii calculated from the NMR data, and (d) a connected porosity (pc) estimated from the NMR data, in porous medias where total pore volume is approximately equal to the connected pore volume or estimated from three-dimensional pore-scale images of the section of the porous media, and wherein the connected porosity of the porous media is calculated by a connected component labeling algorithm in porous medias where total pore volume is greater than the connected pore volume;

wherein the software is further configured to calculate a statistical mean of directional permeability of the section of the porous media using the formula:

$$\langle k \rangle_{SM} = \frac{\phi_c}{8 C_H \tau_H^2} \langle r_P^2 \rangle_{SM}.$$

In a third embodiment, a computerized method of estimating directional permeability (k) of a section of a porous media that is either fully or partially saturated with water, includes:

storing, in computerized memory, measurements performed on the section of the porous media, wherein the measurements comprise (i) nuclear magnetic resonance (NMR) data comprising transverse magnetization decay values (T2), (ii) σR as the electrical conductivity of the section of the porous media fully saturated with brine and (iii) ow as the conductivity of the brine;

using a processor to implement software stored in computerized memory, wherein the software is configured to independently calculate the directional permeability from fabric parameters comprising pore-size distribution (rP) and effective pore radii calculated from the NMR data, and wherein the software is further configured to calculate a statistical mean of directional permeability of the section of the porous media using the formula:

$$k = \frac{\langle r_P^2 \rangle_{SM}}{8} \frac{\sigma_R}{\sigma_w}.$$

BRIEF DESCRIPTION OF THE FIGURES

FIG. 7A is a schematic illustration of pore-scale binary images obtained from carbonates samples (a) C1 (Dong, 2007) with black and gray regions represent pores and grains, respectively.

FIG. 7B is a schematic illustration of pore-scale obtained from carbonates samples (b) C2 (Dong, 2007) with black and gray regions represent pores and grains, respectively.

FIG. 8A is a schematic illustration of NMR T2 distribution obtained from pore-scale simulations in representative 3D pore-scale images from rock types (a) C1 of FIG. 7A.

DETAILED DESCRIPTION

Figure 1:
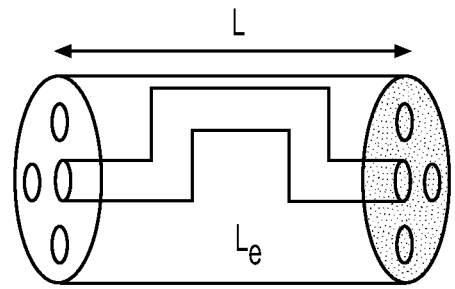
FIG. 1 is a conceptual sketch of a bundle of capillary tubes to represent porous media (Garcia and Heidari, 2016).

Kozeny (1927) assumed that the network of interconnected and tortuous flow pathways in a porous rock could be adequately represented by a bundle of capillary tubes. FIG. 1 shows the conceptual model to represent the porous media by tortuous capillary tubes of constant area.

This assumption allowed Kozeny (1927) to analytically derive an equation relating the permeability of the porous medium, k, to geometrical parameters of the porous medium via $$k = \frac{r_H^2 \phi}{8\tau_H^2}, \quad (1)$$

where $r_H$ is the hydraulic radius, $\phi$ is the porosity, and $\tau_H$ is the hydraulic tortuosity. The tortuosity is defined as the ratio of the tortuous length of the pore channels, through which the fluid flows, between two parallel planes where the pressure difference is applied, divided by the distance between the planes (Clennel, 1997; Garcia and Heidari, 2016), and is given by $$\tau_H = \frac{L_e}{L}. \quad (2)$$

The application of Equation 1 to well-log-based assessment of permeability is limited due to the uncertainties in determining $r_H$ and $\tau_H$. Consequently, it became a conventional practice to utilize core-scale correlations between measured porosity and permeability in log-scale applications (Nelson, 1994). The most common correlation between porosity and permeability is given by $$\log(k) = a' + b' \log(\phi) \quad (3)$$

where a' and b' are calibration constants devoid of any physical meaning.

Several semi-empirical permeability correlations incorporating irreducible water saturation, $S_{wi}$, have been proposed. Example of such models include the ones proposed by Wyllie and Rose (1950), Tixier (1949), Timur (1968), and Coates and Dumanoir (1974), given by $$k = a \frac{\phi^b}{S_{wi}^c}, \quad (4)$$

$$k = 62.5 \frac{\phi^6}{S_{wi}^2}, \quad (5)$$

$$k = 8.58 \frac{\phi^{4.4}}{S_{wi}^2}, \text{ and} \quad (6)$$

$$k = 4.90 \frac{\phi^4 (1 - S_{wi})^2}{S_{wi}^4}, \quad (7)$$

respectively. The irreducible water saturation in these models can indirectly represent the impact of pore-throat size on rock permeability. However, irreducible water saturation itself does not capture the anisotropic characteristics of permeability. Furthermore, the irreducible water saturation might not be available depth-by-depth in the formations with significant spatial heterogeneity. In such cases, all these semi-empirical models given by Equations 4 to 7 are ultimately reduced to particular instances of Equation 3.

When core samples are available for calibration, the porosity-permeability correlations given by Equations 3 to 7 provide reliable estimates in most siliciclastic rocks. In such cases, intergranular pores are well-connected and the pore volume contributing to fluid flow is approximately equal to the total porosity. In contrast, carbonate rocks often contain intragranular pores, vugs, various pore types, and bimodal pore-size distributions as a result of variable depositional cycles and severe diagenesis. In such complex formations, the incorporation of rock fabric in permeability models, as in Equation 1, can improve estimates of permeability. However, the problem still lies on how to determine fabric-related parameters directly from well-log measurements.

An integrated workflow combining complementary petrophysical measurements can be designed to provide rock fabric features. For instance, the relationship between the diffusive problems of electric current flux and fluid flow in porous media is well known (Wyllie and Spangler, 1952; Katz and Thompson, 1987). However, it was not until the work of Johnson et al. (1986) that the relationship between conductivity and fluid flow has been rigorously determined. Johnson et al. (1986) derived this relationship as $$k = \frac{\Lambda^2}{8F}, \quad (8)$$

where F is the formation factor, defined by Archie (1942) as the resistivity of the rock, 100% saturated with water, divided by the resistivity of the brine, and $\Lambda$ is parameter characteristic of the geometry of the porous medium and is defined as $$\frac{2}{\Lambda} = \frac{\int |\nabla \Phi|^2 dS}{\int |\nabla \Phi|^2 dV}, \quad (9)$$

where $\nabla \Phi$ is the electric potential gradient, and S and V stand for pore surface and pore volume, respectively. Avellaneda and Torquato (1991) and Bernabé and Revil (1995) re-derived Equation 8 independently. Various methods are proposed to estimate the parameter characteristic of the geometry of porous media (Revil and Cathles, 1999; Revil and Florsch, 2010). However, a practical procedure to rigorously calculate $\Lambda$ from well-log measurements is not available.

Katz and Thompson (1987) derived a direct relationship between permeability and formation factor based on percolation theory. The Katz and Thompson (1987) model is given by $$k = \frac{1}{226} l_c^2 \frac{\sigma_R}{\sigma_w}, \quad (10)$$

where $\sigma_R$ is the electrical conductivity of the brine saturated rock, $\sigma_w$ is the brine conductivity, and e is the characteristic length of pore space, which can be obtained from mercury injection capillary pressure (MICP) measurements. Such electrical-based model has the potential of estimating directional permeability based on directional conductivity. Moreover, this model has been successfully applied to estimate permeability in both sandstone and carbonate formations (Katz and Thompson, 1987). However, the application of Katz and Thompson (1987) method requires pore-scale characterization of pore network that can be obtained by MICP measurements. These measurements might not be available for every rock sample or at every desired depth in the formation. Electrical resistivity measurements have also been used to estimate pore-throat size and other pore-network properties that influence permeability (Ziarani and Aguilera, 2012). Furthermore, the complexity of formations such as carbonates is taken into through pore-scale image analysis for permeability assessment. Oyewole et al. (2016) incorporated a conducting pore network parameter into a new resistivity-based model to estimate directional permeability in carbonate.

NMR-based permeability models (e.g., Coates and Schlumberger-Doll-Research) enable incorporation of complex pore-size distribution in permeability evaluation. The existing NMR-based methods, are however, highly dependent on calibration efforts. Furthermore, NMR measurements do not provide information about pore-network connectivity and pore-throat size, which are essential in assessment of permeability. Electrical measurements, however, are highly sensitive to pore-network connectivity and pore-throat size. Thus, combing NMR and electrical measurements (i.e., conductivity and dielectric constant) can potentially improve permeability estimates, while minimizing core-based calibration efforts. Weller et al. (2010) compared the permeability estimates from NMR and spectral induced polarization (SIP) measurements. Osterman et al. (2015) also compared permeability models using SIP and NMR measurements on sandstone cores. They used the dielectric-based permeability model proposed by Revil and Florsch (2010) and Schlumberger-Doll-Research NMR-based model, respectively. However, dielectric and NMR measurements are not jointly interpreted through physics-based models to estimate permeability. In addition, low-frequency SIP measurements are often not available.

This disclosure proposes a new workflow to estimate permeability by combining electric resistivity, dielectric permittivity, and nuclear magnetic resonance measurements. One aspect of the new workflow is that it honors rock fabric through joint interpretation of the aforementioned measurements and consequently completely eliminates the need for core-based calibration efforts and cutoff values. It also allows simultaneous and accurate assessment of tortuosity, pore-radius distribution, pore-throat distribution, effective pore radius, effective pore throat size, and porosity. Assessment of pore-throat size is considered as a highlight outcome of this new method, because quantification of this important rock properties has been only possible through MICP measurements or digital pore-scale image evaluation. The embodiments described herein apply the new workflow in both pore-scale and core-scale domains to estimate permeability. Permeability estimates using the new workflow are compared against numerical simulation results and laboratory measurements, in the pore- and core-scale domains, respectively. Furthermore, the embodiments enable comparing the permeability estimates from the proposed workflow against conventional porosity-permeability correlations. Finally, the method includes comparing the throat-size distribution calculated from the introduced workflow against throat-size distribution obtained from MICP measurements.

Method

In certain non-limiting embodiments, the work herein describes a new workflow that integrates NMR, dielectric permittivity, and electrical conductivity measurements to estimate permeability, honoring rock fabric. Permeability is a function of porosity, tortuosity, and pore and pore-throat size. The challenge in permeability assessment is to independently determine each one of these parameters without resorting to calibrations. Porosity can be estimated via numerous approaches from well-log measurements (e.g., neutron-density logs and acoustic measurements). In numerous embodiments, this work explains estimating porosity from the interpretation of the NMR transverse magnetization decay (Coates et al., 1999) and estimating tortuosity from high-frequency (i.e., 960 MHz) dielectric permittivity measurements by applying the concept of capacitive formation factor as a measure of pore structure (Bitterlich and Wobking, 1970; Clennel, 1997). Finally, this disclosure addresses the need to estimate the effective pore-throat size. The $T_2$ (transverse magnetization decay relaxation time) distribution calculated from the NMR measurements translates into a multi-modal pore-size distribution. As such, this disclosure presents a new mechanistic function to calculate the effective pore radius from pore-size distribution. The relationship between pore size and pore-throat size can be approximated by the constriction factor. Constriction factor is estimated from electrical resistivity measurements.

Proposed permeability model. In order to use a calibration-free permeability model, the work uses the assumption that the pore network can be represented by a network of tortuous and interconnected flow paths (Kozeny, 1927; Peters, 2012). Under this assumption, several models have been derived from fundamental principles relating permeability to petrophysical properties such as porosity, tortuosity, and pore-throat size. The most notable of these models are Kozeny (1927), Equation 1, and Carman (1937) models. More recently, Berg (2014) analytically derived a new permeability model given by $$k = \frac{r_P^2 \phi_c}{8 C_H \tau_H^2}, \tag{11}$$

where $r_P$ is the pore radius, $\phi_c$ is the connected porosity, $C_H$ the constriction factor, $\tau_H$ is the hydraulic tortuosity, and k is the permeability. The importance of Equation 11 resides in the fact that it establishes a direct relationship between permeability, pore radius, tortuosity, and constriction factor. The constriction factor measures the degree of variation in cross-sectional area of the fluid flow pathways (Berg, 2012 and 2014). Assuming a Stokes flow problem, the constriction factor is rigorously defined as $$C_H = \frac{1}{L^2} \int_0^L A^2(x) dx \int_0^L \frac{1}{A^2(x)} dx, \tag{12}$$

for a straight circular pore channel of length L with cross-sectional area $A(x)$ at point x. It should be noted that the constriction factor defined for the electrical conductivity measurements is slightly different than the definition in Equation 12. The dissimilarities occur due to different boundary conditions between the physics of electric current flux and fluid flow. In this paper, we estimate the constriction factor from electrical conductivity measurements, which will be described in detail in the next sections. Therefore, we approximate the constriction factor by the ratio between the cross-sectional area of the pore to the cross-sectional area of the throat as $$C_H \cong \frac{A_P}{A_T} = \frac{r_P^2}{r_T^2}, \tag{13}$$

where $A_P$ is the cross-sectional area of the pore, $A_T$ is the cross-sectional area of the throat, and $r_T$ is the throat radius.

Substituting Equation 13 into Equation 11 results in $$k = \frac{r_T^2 \phi_c}{8\tau_H^2}, \quad (14)$$

which is the similar to the well-known Kozeny (1927) model given by Equation 1.

In order to estimate permeability from Equation 11, one needs to calculate porosity, tortuosity, constriction factor, and effective pore size. Alternatively, Equation 14 is available in which case the data requires throat size instead of pore size and constriction factor. The pore-throat-radius distribution can be obtained from MICP measurements. The problem is that MICP measurements are not always available and they require core samples. The pore-radius distribution, on the other hand, can be estimated from the interpretation of NMR transverse magnetization decay measurements. The advantage of such approach lies in the possibility of using well-log measurements to estimate effective pore size. However, we need to provide a physics-based equation that can reliably estimate effective pore-throat size from pore-size distribution. It should be noted that NMR $T_2$ distribution has been widely used for assessment of pore-size distribution. However, the pore-size distribution from NMR measurements does not necessarily contribute to permeability of the rock. Thus, assessment of an effective pore size is required for reliable permeability assessment.

Figure 2A:
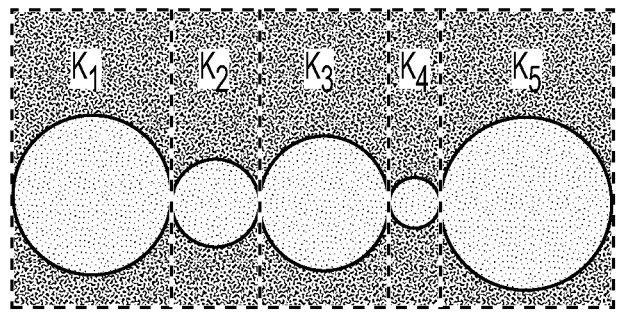
FIG. 2A is a schematic illustration of a simplified pore structure with pores of different sizes connected in series.
Figure 2B:
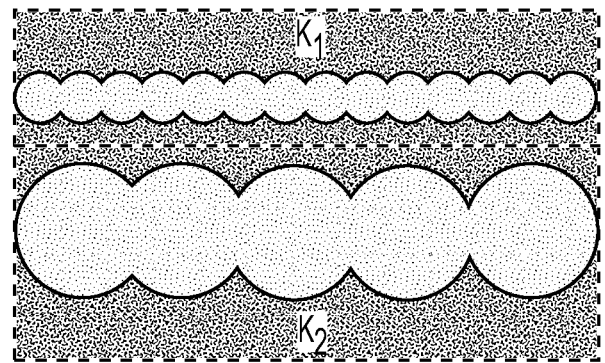
FIG. 2B is a schematic illustration of a simplified pore structure with pores of different sizes connected in parallel.
Figure 2C:
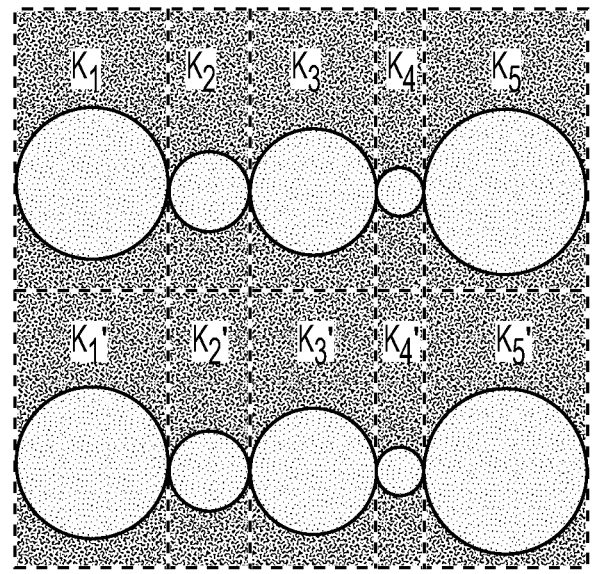
FIG. 2C is a schematic illustration of a simplified pore structure with pores of different sizes connected in combined series and parallel configurations.

Estimation of effective pore radius. To estimate the effective pore radius, we consider that the pores with different radii are distributed in the porous media in different configurations. FIG. 2 illustrates the two extreme cases of pores with different sizes connected in series (FIG. 2a) and distributed in parallel configurations (FIG. 2b). FIG. 2c demonstrates a simplified combination of the aforementioned two extreme configurations.

The effective pore size is defined as the portion of the pores that contribute to permeability of the rock. Each pore size $r_{Pi}$ is associated to a distinct permeability $k_i$. If one assumes that the pore space can be approximated by pores of different sizes connected in series, as illustrated in FIG. 2a, the effective permeability is calculated by the harmonic mean, as $$\langle k \rangle_{HM} = \frac{1}{\sum_i \frac{x_i}{k_i}}, \quad (15)$$

where $k_i$ represents the permeability of the rock with pore radius of $r_{Pi}$, $x_i$ is the volume fraction of the pores with radius $r_{Pi}$, HM stands for harmonic mean, and $\langle k \rangle_{HM}$ is the effective permeability. On the other hand, by assuming that the pore space can be approximated by pores of different sizes connected in parallel, as illustrated in FIG. 2b, the effective permeability is calculated by the arithmetic mean as $$\langle k \rangle_{AM} = \sum_i x_i k_i, \quad (16)$$

where AM stands for arithmetic mean, and $\langle k \rangle_{AM}$ is the effective permeability.

In reality, the pore structure is more complex than the simplified cases illustrated by FIGS. 2a and 2b. The pore network is a combination of pores of different sizes connected in series and in parallel, as illustrated in FIG. 2c. Consequently, the effective permeability of the porous media is an intermediate value between the estimates calculated from Equations 15 and 16. However, the selection of the adequate statistical average requires detailed information on the topology of the pore network. In principle, we can obtain this information from pore-scale images of the rocks, but these images are not always available. Furthermore, the objective of this paper to minimize the need for excessive imaging and core measurements for calibration efforts. Thus, we take an approximation approach for combing the two scenarios illustrated in FIGS. 2a and 2b. A simple alternative to calculate a permeability between the estimates obtained from Equations 15 and 16 is through the geometric mean as $$\langle k \rangle_{GM} = \prod_i k_i^{x_i}. \quad (17)$$

where GM stands for geometric mean, and the effective permeability is $\langle k \rangle_{GM}$.

One can apply the proposed workflow with any particular statistical average, as long as it is adequate to the pore structure under investigation. Hence, this disclosure refers to Equations 15 to 17 simply as statistical means, SM. The choice of the statistical approach will depend of the scale of measurements as well as rock properties.

To clarify the applications of the aforementioned statistical approaches, consider the cases of pore-scale and core-scale permeability assessment. In the pore-scale domain, the work utilizes a harmonic mean. Pore-scale images only map a small fraction of the rock and the number of parallel flow pathways is limited. In the core-scale domain, on the other hand, geometric mean is a more reliable option. Because, core samples map a larger fraction of the formation as compared to the pore-scale rock images. Hence, there is a higher number of parallel flow pathways in the core-scale applications.

Next, in order to establish the direct relationship between effective pore size and effective permeability, we need to substitute Equation 11 for each pore size into one of the Equations 15 to 17. The challenge, however, remains on determining tortuosity, porosity, and constriction factor associated with each pore size. In order to simplify the workflow, the embodiments herein may assume that these parameters (i.e., tortuosity, constriction factor, and porosity) are average properties of the entire porous medium under investigation. Consequently, the effective permeability can be calculated as a function of the statistical mean of the distribution of $r_P^2$, via $$\langle k \rangle_{SM} = \left\langle \frac{r_P^2 \phi_c}{8 C_H \tau_H^2} \right\rangle_{SM} = \frac{\phi_c}{8 C_H \tau_H^2} \langle r_P^2 \rangle_{SM} \quad (18)$$

where $\langle \cdot \rangle_{SM}$ is the statistical mean operator.

Next, NMR $T_2$ distribution is used to calculate the effective pore radius. The transverse relaxation observed in NMR measurements is dominated by three main mechanisms: the surface relaxation, the bulk relaxation, and the diffusive relaxation. Thus, the T, measurements can be expressed as (Bloembergen et al., 1948)

$$\frac{1}{T_2} = \frac{1}{T_{2b}} + \rho\frac{S}{V} + \frac{D[\gamma GT_E]^2}{12} \quad (19)$$

where $T_{2b}$ is the bulk relaxation time (s), $\rho$ is the surface relaxivity of the pores (m/s), S is the total surface of the pores in contact with the fluid (m²), V is the total volume of the pores containing the fluid (m), D is the molecular diffusion coefficient (m²/s), G is the magnetic gradient strength (T/m), $T_E$ is the time between spin echoes in the Carr, Purcell, Meiboom and Gill (CPMG) sequence (s), and $\gamma$ is the gyromagnetic ratio of the proton (rad/T). In this paper, magnetic gradient is assumed as negligible. Hence, the diffusion relaxation term in Equation 19 can be considered to be negligible. Furthermore, there is an assumption that the pore network can be approximated by a distribution of spherical pores, as illustrated in FIG. 2. Consequently, the surface-to-volume ratio, S/V, for each pore can be calculated via $$\frac{S}{V} = \frac{3}{r_P}, \quad (20)$$

and, consequently, one can calculate the effective pore radius, $r_{P,eff}$, as which is an input to Equation 18 to calculate the permeability. KEY MISSING TEXT Independent from the choice of the adequate statistical mean for the porous media (depending on the scale of the measurements and the pore structure), Equation 19 can be used to estimate effective pore-size distribution from the $T_2$ distribution under the assumption of spherical pores. The most important point in this model is that the averaging is performed on the $r_P^2$ distribution and not directly on the $T_2$ distribution. Furthermore, the simplifying assumption of spherical pores can be eliminated, if representative pore-scale images of rock samples are available. It is possible to estimate the surface-to-volume ratio directly from analysis of pore-scale images. In that case, establishing a relationship between surface-to-volume ratio and actual pore radius calculated from image analysis is necessary. The next step includes assessment of tortuosity and constriction factor from dielectric permittivity and electrical resistivity measurements. Estimation of tortuosity. Bitterlich and Wobking (1970) proposed a capacitative formation factor as a measure of pore structure (Clennel, 1997), defined as $$F_C = \frac{\varepsilon_f}{\varepsilon_R} = \frac{\tau_{eW}^2}{\phi_T}, \quad (22)$$

where $\varepsilon_f$ is the relative dielectric permittivity of the fluid, $\varepsilon_R$ is the relative dielectric permittivity of the rock, $\phi_T$ is the total porosity, and $\tau_{eW}$ corresponds to the dielectric tortuosity, similar to the definition adopted by Wyllie and Rose (1950). Equation 22 allows us to calculate the tortuosity from the dielectric permittivity measurements of the rock-fluid system performed at 960 MHz.

The only parameter left to be determined in our permeability assessment workflow is the constriction factor. The constriction factor may be estimated from electrical resistivity measurements, as described in the following section.

Estimation of constriction factor. Berg (2012) analytically derived an equation for the electrical conductivity of porous media as $$\frac{\sigma_R}{\sigma_w} = \frac{\phi_c}{C_E \tau_E^2}, \quad (23)$$

where $C_E$ is the electrical constriction factor, and $\tau_E$ is the electrical tortuosity. Equation 23 can be applied to calculate the constriction factor. The inputs to Equation 23 include the porosity estimated from NMR measurements (or any other available method such as total porosity estimates from neutron and density logs), the tortuosity estimated from dielectric measurements, and the electrical resistivity measurements. One may assume that the tortuosity obtained from dielectric permittivity reliably approximates both the electrical and hydraulic tortuosity values. Moreover, this disclosure may make use of an assumption that the electrical and hydraulic constriction factors are approximately the same.

Finally, after assessment of porosity, effective pore size, tortuosity, and constriction factor, permeability can be estimated using Equation 18. Additionally, one can estimate the pore-throat-size distribution by combining Equation 13 with the pore-size distribution obtained from the interpretation of NMR measurements (Equations 19 and 20) and the constriction factor (Equation 23).

Model application. The application of the proposed model to a given formation requires a sequence of steps detailed below.

1. Obtain $T_2$ distribution from NMR transverse magnetization measurements. Then, estimate porosity and calculate pore-size distribution from Equations 19 and 20. The inputs to Equation 20 are the surface relaxivity of the pores and the bulk relaxation time.
2. Calculate effective pore size from Equation 21. The inputs to Equation 21 are also the surface relaxivity of the pores and the bulk relaxation time.
3. Obtain dielectric permittivity measurements of the porous media at 960 MHz and calculate tortuosity from Equation 22. The inputs to Equation 22 are the porosity and the dielectric permittivity of water at 960 MHz.
4. Measure electrical conductivity of the rock and calculate constriction factor through Equation 23. The inputs to Equation 23 are the tortuosity calculated in step 3, the porosity, and the conductivity of water.
5. Calculate permeability from Equation 18. The inputs to Equation 18 are the estimated porosity and effective pore size, tortuosity, and constriction factor, from NMR, dielectric permittivity, and electrical conductivity measurements, respectively. In the absence of dielectric permittivity measurements, we propose an alternative procedure detailed in Appendix B.
6. Calculate throat-size distribution from Equation 13 using pore-size distribution from step 1 and constriction factor from step 4.

Figure 3:
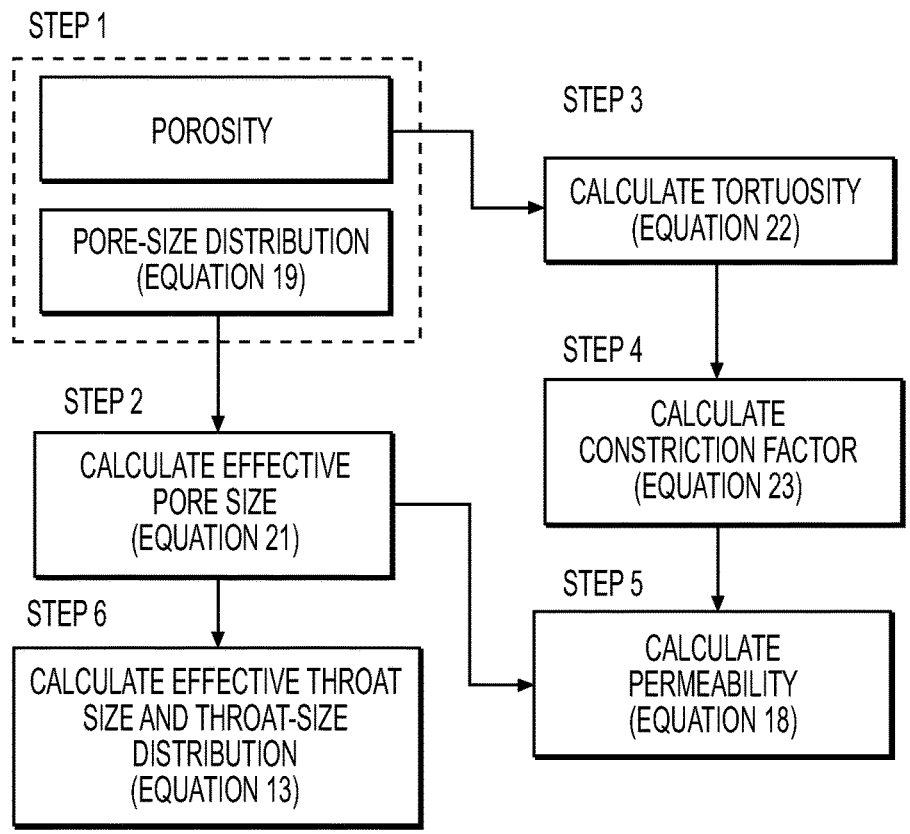
FIG. 3 is a schematic illustration of the proposed workflow for estimating permeability, tortuosity, and pore-throat-size distribution through joint interpretation of NMR, dielectric permittivity, and resistivity measurements.

FIG. 3 illustrates the workflow described by the steps 1 to 6. Strategies for Model Verification Testing the proposed workflow (FIG. 3) in the pore- and core-scale domains has been conducted as follows. The permeability estimates are compared against those estimated in the pore-scale domain using pore-scale numerical simulations and in the core-scale domain using laboratory measurements.

To verify the reliability of the introduced workflow in the pore-scale domain, three-dimensional (3D) pore-scale images were selected from two carbonate formations. Each pore-scale image is split into non-intersecting samples with at least 200×200×200 voxels. Then, to determine the actual permeability of these subsamples through numerical simulation of fluid flow, the application of the proposed workflow requires $T_2$ distribution, dielectric permittivity, and electrical resistivity of each subsample. Each one of these values is obtained from a specific numerical simulation described in Appendix A. The testing then applies the proposed workflow to estimate the permeability of the pore-scale samples and compare the results against the actual permeability.

Next, testing the new workflow in the core-scale domain is completed. For this purpose, five (5) core samples from three (3) carbonate formations are selected and perform NMR, dielectric permittivity, and electrical resistivity measurements. Then, the next steps are to measure the actual permeability using a core-flood system, compare the permeability estimates against those obtained from the core measurements, and also perform MICP measurements to cross-validate the estimates of pore-throat-size distribution by the new workflow.

Figure 4:
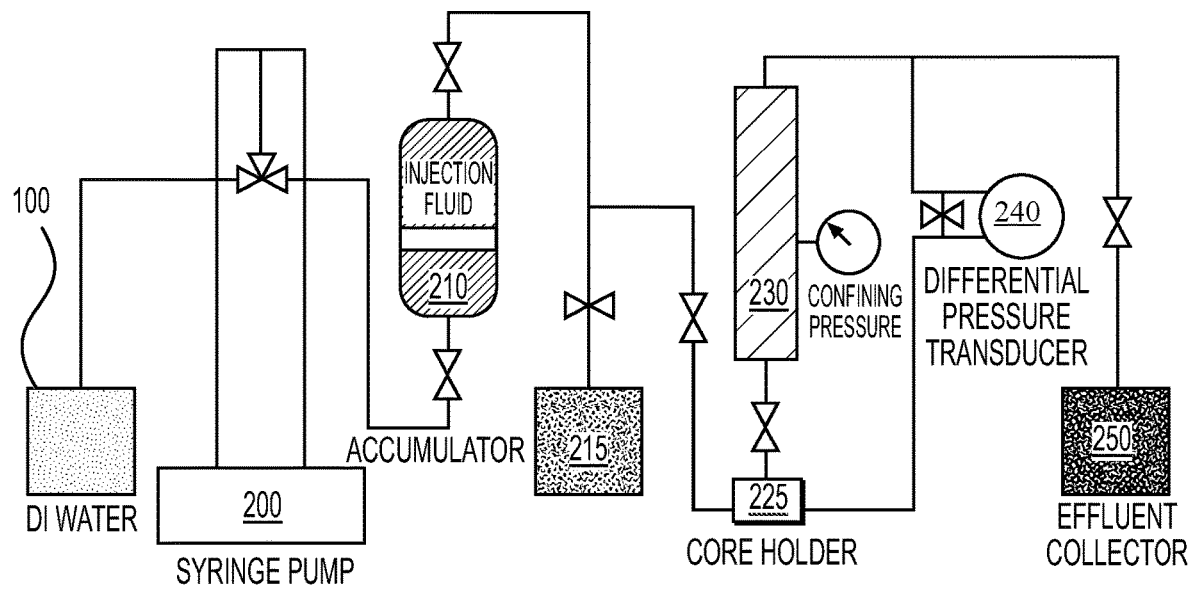
FIG. 4 is a schematic illustration of a diagram of experimental setup for permeability measurements in the core samples.

Permeability assessment. FIG. 4 illustrates the core-flood setup used for the permeability assessment of core samples. As shown therein, the set-up utilizes an example arrangement of instruments including a source 100 of deionized water, a syringe pump 200, a reservoir 210 of injection fluid, an accumulator section 215, a core holder 225 holding a section of porous media 300, a pressure regulator 230, a differential pressure transducer 240, and an effluent collector 250.

The experiment consists of injecting brine with a constant flow rate through the core sample and measuring the pressure drop across the sample. Applying a confining pressure of 1000 psi to the core samples provides a route to measure the pressure across the rock using a differential pressure transducer. Once the pressure drop stabilizes, calculating the permeability directly from Darcy's law described by Equation A1 is completed. The setup includes an ISCO series LC-2600 pump and Rosemount pressure transducer connected to a computer running National Instruments LabVIEW. This disclosure describes performing the experiments at two different constant flow rates over time: 1 cm³/min and 10 cm³/min, measuring the pressure drop across the sample at each flow rate and calculate the permeability. This allows for verifying that the permeability calculated at two different flow rates are within 5% relative difference for all core samples.

NMR measurements. By measuring the relaxation time of the transverse magnetization decay ($T_2$) using a 2 MHz Magritek NMR Rock Core Analyzer with a CPMG pulse sequence, the testing method sets the inter-experiment delay to be 5 s, the minimum signal-to-noise ratio (SNR) to 200, and the echo spacing to 100 µs. Then, measuring the $T_2$ distribution of each fully brine-saturated core sample is completed, and NMR measurements are also performed to control the quality of the resistivity and dielectric measurements. Measuring the $T_2$ distribution before and after electrical measurements verifies that brine evaporation was negligible during the experiments. Dielectric permittivity measurements. Measuring the dielectric permittivity of the core samples uses a Keysight E5071C network analyzer. The measurements reported in this paper require a simple terminated coaxial probe, Keysight N1501A, which is placed on top of the samples. The network analyzer and the coaxial probe are illustrated in FIG. 5.

The disclosed method includes placing the samples (1½× 1½" or 1½"×2") in contact with the coaxial probe with a constant pressure to enforce the best contact between the sample and the probe. Then the method measures the real and imaginary parts of the dielectric permittivity in the frequency range of 20 MHz to 1 GHz. The measurements are repeated several times in both sides of the sample to ensure that the roughness of the surface of the samples is not affecting the quality of the measurements.

Figure 6:
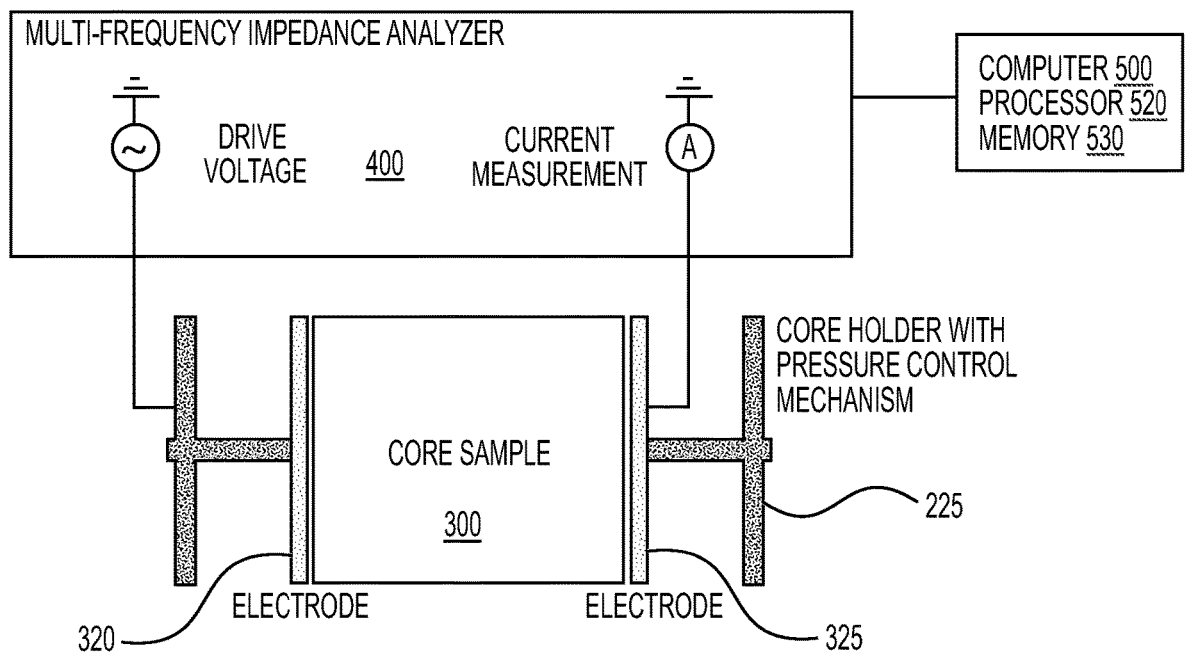
FIG. 6 is a schematic illustration of the experimental setup for impedance spectroscopy measurements of the core samples in the frequency range of 10 Hz to 500 kHz.

Resistivity measurements. Electrical impedance spectroscopy (EIS) or equivalently spectral induced polarization (SIP) consists of measuring the complex impedances at frequencies below 1 MHz. In this paper, using a two-terminal setup of a multi-frequency impedance analyzer (MFIA) from Zurich Instruments configures the setup for measuring the complex impedance of the rock samples as illustrated in FIG. 6. In this non-limiting arrangement, a multi-frequency impedance analyzer 400 is utilized to measure an electrical circuit response when the core holder is attached to a section of porous media under consideration. One end of the core holder is attached to a circuit anode 320 and a second end of the core holder is attached to a circuit cathode 325. In this way, the core holder 225 is configured to hold a section of porous media (i.e., a core sample) within an electrical circuit for analysis of electric parameters such as permittivity, conductivity, and impedance. The multi-frequency impedance analyzer is configured with an analyzer computer having appropriate processors, software, displays, and output devices for use herein.

Figure 5A:
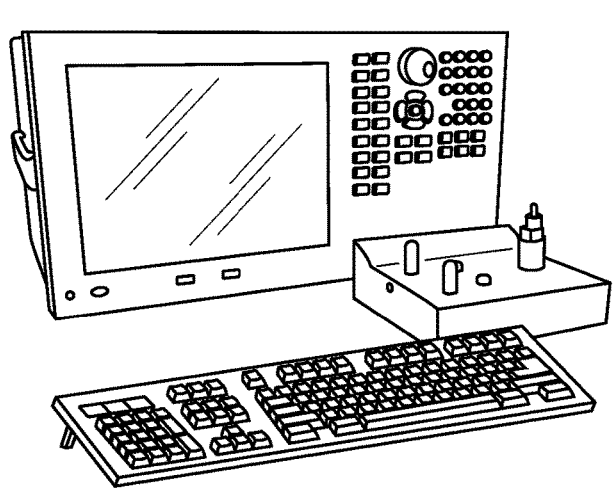
FIG. 5A is a schematic illustration of a network analyzer, Keysight E5071C, and coaxial probe, Keysight N1501A used for dielectric permittivity measurements on fully water saturated core samples in the frequency range of 20 MHz to 1 GHz.
Figure 5B:
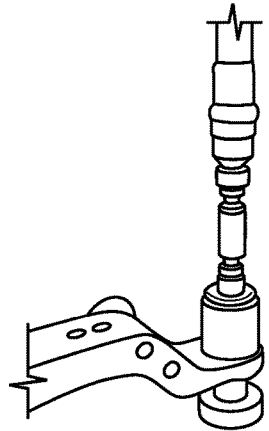
FIG. 5B is a schematic illustration of network analyzer, Keysight E5071C, and coaxial probe, Keysight N1501A used for dielectric permittivity measurements on fully water saturated core samples in the frequency range of 20 MHz to 1 GHz.

In one embodiment described herein by example and without limiting the disclosure, a computerized system such as the set-up of FIGS. 4-6 may be used to estimate pore-throat-size distribution in a section of porous media 300. The system may incorporate the components described above in numerous combinations to enable a systematic analysis of a core sample 300 with at least one computer comprising a processor and computerized memory. An imaging device, such as a magnetic resonance imaging device, may be configured to collect nuclear magnetic resonance (NMR) data pertaining to the section of porous media 300 and transmitting the NMR data to the memory. A core holder is configured for attaching the section of porous media between an anode and a cathode. A voltage source 312 is connected to the anode 320, and an impedance analysis circuit 400 is connected to the cathode 325 and receives current through the section of porous media 300. The impedance analysis circuit may be a computerized multi-frequency impedance analyzer 400 that transmits at least one of impedance data and dielectric permittivity data regarding the current to a separate computer 500 connected to the test equipment, and at least one processor 520 calculates an effective pore-throat size from the NMR data, the impedance data, and the permittivity data stored in memory 530.

The embodiments shown by example in FIGS. 4-6 may also be described as a computerized system for estimating pore-throat-size distribution in the section of porous media. At least one computer 500 is connected to the overall test set-up and uses at least a processor and computer readable memory to effect the measurement collection, data analysis and calculations necessary to make the analysis herein complete. For example, an imaging device such as an MRI diagnostic tool, may be configured to collect nuclear magnetic resonance (NMR) data pertaining to the section of porous media and transmits the NMR data to the memory of the computer 500. A holder 225 includes opposite attachment points 227 configured to connect to opposite ends of the section of porous media 300, wherein the opposite attachment points are further configured to provide, simultaneously, current flow and fluid flow through the attachment points in at least one electrical circuit and at least one fluid circuit. Both a fluid and electrical current flow through the sample of porous media 300 as described herein. An anode 320 is connected to one of the attachment points and a cathode 325 is connected to the other attachment point, defining an electrical circuit connected to the holder. The holder 225 is further configured for the fluid flow through the anode, the holder, and the cathode even when the core sample is attached as shown in FIG. 6. In one non-limiting embodiment, a pressure regulating assembly 230 is connected to the cathode, and a voltage source 415 is connected to the anode. An impedance analysis circuit such as a multi-frequency impedance analyzer 400 connects to the cathode and receives current through the section of porous media. The impedance analysis circuit transmits at least one of impedance data and permittivity data regarding the current to the computer 500, and the processor 520 therein calculates, with data stored in memory 530, an effective pore-throat size from the NMR data, the impedance data, and the permittivity data.

The core samples are placed in a core holder with wing nuts that are tightened along a threaded rod. The wing nuts are responsible for applying a pressure on the two end faces of core sample and maintaining a solid contact. The two metallic electrodes of the core holder are connected to the MFIA. A sinusoidal voltage excitation in the frequency range of 10 Hz to 500 kHz with an amplitude of 300 mV is applied to the core samples. The complex impedance and the conductivity of the sample is calculated from the resistance measured at the minimum phase.

Results

In this section, this section of the disclosure shows the results of testing the proposed workflow to estimate permeability in both pore- and core-scale domains. For verification of the new method in the pore-scale domain, pore-scale images are selected from two carbonate formations, C1 (Dong, 2007) and C2 and then dividing each pore-scale image into subsamples named, N_C1_1 to N_C1_8 for carbonate C1, and N_C2_1 to N_C2_12 for carbonate C2. For verification of the new method in the core-scale domain, five samples are selected from three formations: three from Texas Cream limestone, one from Indiana limestone, and one from Estaillades limestone. These samples are identified as E_TC_1 to E_TC_3 (1½"×1½"), E_IN (1½'×2"), and E_ES (1½"×1½"), respectively. Furthermore, obtaining the throat-size distribution from MICP measurements performed in two core samples (25 mm×25 mm) from Texas Cream limestone allows the method to compare the MICP results against the throat-size distribution estimated from the proposed workflow.

Application to the pore-scale domain. In the pore scale domin, 3D micro-Computed Tomography (CT) images are prepared for carbonates C1 (Dong, 2007) and C2 with a pixel resolution of 2.85 μm and 3.46 μm, and dimensions of 400×400×400 and 600×600×900 voxels, respectively. Next, the method discloses segmenting the micro-CT images from rock type C2 into pore and grain regions using Fiji ImageJ (Schindelin et al., 2012), an open source image processing software. FIG. 7 illustrates the binarized pore-scale images of carbonates C1 and C2. Black and gray regions represent pores and grains, respectively.

Each 3D pore-scale binary image is divided into samples with 200³ and 300³ voxels for rock types C1 and C2, respectively. Then, numerical simulations are performed for fluid flow through these samples and this set up is configured to calculate their permeability in the x-, y-, and z-directions (i.e., kx, ky, and kz). Tables 1 and 2 list the values of permeability obtained from numerical simulations for the samples from rock types C1 and C2, respectively.

TABLE 1

Rock type C1: Permeability values obtained in the x-, y-, and z-directions from numerical simulations for the pore-scale rock images.

| Sample | $k_x$ (mD) | $k_y$ (mD) | $k_z$ (mD) | φ (%) |
|---|---|---|---|---|
| N_C1_1 | 118.1 | 168.3 | 186.5 | 17.6 |
| N_C1_2 | 1513.1 | 906.3 | 1721.5 | 19.3 |
| N_C1_3 | 1685.8 | 3683.2 | 3117.7 | 25.7 |
| N_C1_4 | 3025.1 | 901.5 | 880.8 | 26.5 |
| N_C1_5 | 209.6 | 307.1 | 286.5 | 19.4 |
| N_C1_6 | 1546.5 | 1184.1 | 351.0 | 21.8 |
| N_C1_7 | 2238.9 | 1667.9 | 922.1 | 21.2 |
| N_C1_8 | 3095.1 | 4851.1 | 2551.6 | 34.4 |

TABLE 2

Rock type C2: Permeability values obtained in the x-, y-, and z-directions from numerical simulations for the pore-scale rock images.

| Sample | $k_x$ (mD) | $k_y$ (mD) | $k_z$ (mD) | φ (%) |
|---|---|---|---|---|
| N_C2_1 | 169.5 | 89.7 | 425.1 | 15.4 |
| N_C2_2 | 45.8 | 1634.7 | 1.8 | 29.0 |
| N_C2_3 | 74.6 | 48.8 | 30.5 | 13.0 |
| N_C2_4 | 32.4 | 53.5 | 97.2 | 16.5 |
| N_C2_5 | 189.4 | 121.5 | 98.1 | 18.9 |
| N_C2_6 | 160.5 | 215.4 | 175.8 | 14.9 |
| N_C2_7 | 3.6 | 113.4 | 12.9 | 11.6 |
| N_C2_8 | 371.3 | 149.8 | 91.9 | 14.2 |
| N_C2_9 | 4.6 | 17.1 | 28.4 | 10.9 |
| N_C2_10 | 947.2 | 1965.3 | 3123.7 | 30.7 |
| N_C2_11 | 419.5 | 267.9 | 476.7 | 21.2 |
| N_C2_12 | 1118.8 | 110.8 | 1473.7 | 21.5 |

In all electrical conductivity and dielectric permittivity simulations, we assume that the pore space is filled with 2 wt % NaCl brine at 25° C. The electrical properties of water are calculated using Stogryn's (1971) model, resulting in an electrical conductivity of 3.21 S/m. These properties correspond to the brine used in the core-scale laboratory measurements. Then, we numerically solve Laplace's equation to determine the electrical potential and calculate the electrical conductivity in the x-, y, and z-directions (i.e., $\sigma_{Rx}$, $\sigma_{Rx}$, and $\sigma_{Rz}$). Moreover, we calculate the connected porosity of each one of the subsamples through the connected component labeling algorithm (Purba et al., 2017).

Tables 3 and 4 show the numerically estimated directional conductivity and connected porosity for the samples from rock types C1 and C2, respectively

TABLE 3

Rock type C1: Electrical conductivity obtained in the x-, y-, and z- directions from pore-scale numerical simulations.

| Sample | $\sigma_{Rx}$ (S/m) | $\sigma_{Ry}$ (S/m) | $\sigma_{Rz}$ (S/m) | $\phi_c$ (%) |
|---|---|---|---|---|
| N_C1_1 | 0.029 | 0.036 | 0.052 | 14.0 |
| N_C1_2 | 0.126 | 0.075 | 0.118 | 16.8 |
| N_C1_3 | 0.197 | 0.178 | 0.241 | 23.3 |
| N_C1_4 | 0.216 | 0.137 | 0.148 | 25.7 |
| N_C1_5 | 0.043 | 0.053 | 0.054 | 16.4 |
| N_C1_6 | 0.139 | 0.108 | 0.061 | 18.2 |
| N_C1_7 | 0.161 | 0.111 | 0.113 | 19.3 |
| N_C1_8 | 0.328 | 0.284 | 0.214 | 32.9 |

TABLE 4

Rock type C2: Electrical conductivity obtained in the x-, y-, and z- directions from pore-scale numerical simulations.

| Subsample | $\sigma_{Rx}$ (S/m) | $\sigma_{Ry}$ (S/m) | $\sigma_{Rz}$ (S/m) | $\phi_c$ (%) |
|---|---|---|---|---|
| N_C2_1 | 0.021 | 0.020 | 0.044 | 13.2 |
| N_C2_2 | 0.011 | 0.105 | 0.297 | 22.9 |
| N_C2_3 | 0.011 | 0.002 | 0.004 | 6.5 |
| N_C2_4 | 0.016 | 0.010 | 0.010 | 10.4 |
| N_C2_5 | 0.023 | 0.017 | 0.016 | 15.7 |
| N_C2_6 | 0.019 | 0.022 | 0.026 | 10.7 |
| N_C2_7 | 0.0001 | 0.019 | 0.022 | 9.2 |
| N_C2_8 | 0.023 | 0.023 | 0.015 | 9.5 |
| N_C2_9 | 0.001 | 0.003 | 0.005 | 2.5 |
| N_C2_10 | 0.067 | 0.089 | 0.177 | 21.8 |
| N_C2_11 | 0.041 | 0.028 | 0.065 | 19.2 |
| N_C2_12 | 0.070 | 0.023 | 0.078 | 15.6 |

Next, a random walk NMR simulator is applied to calculate the transverse magnetization decay in each sample, assuming bulk relaxation time, diffusion coefficient, and surface relaxivity of 3 s, 2.0×10−9 m2/s and 5.0×10−6 m/s, respectively. Initially, the method assigns at least one walker per every four voxels in the pore space. The time step is calculated by assuming that the walkers travelless than 30% of the sample resolution between two consecutive time steps. Then, a curvature-smoothing regularization algorithm to estimate the T2 distribution is applied.

Figure 8B:
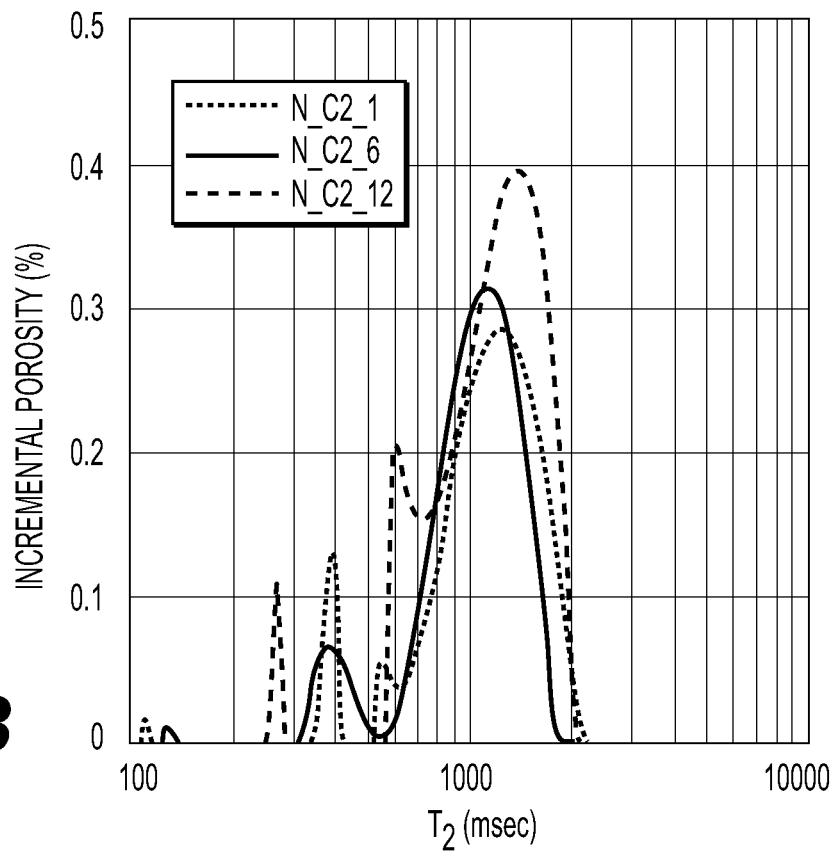
FIG. 8B is a schematic illustration of NMR T2 distribution obtained from pore-scale simulations in representative 3D pore-scale images from rock types (b) C2 of FIG. 7B.

FIGS. 8a and 8b illustrate three representative NMR T2 distributions from samples of rock types C1 and C2 rock, respectively. The T2 distributions obtained from NMR simulations for the other samples are similar to those T2 distributions illustrated in FIGS. 8a and 8b. The T2 distributions of rock types C1 and C2 are dominantly characterized by multi-modal distributions.

Solving Equation A3 through the finite volume method allows for one to calculate the dielectric permittivity using Equation A4. The multi-frequency dielectric permittivity response is calculated at frequencies of 22 MHz, 100 MHz, 350 MHz, and 960 MHz, which correspond to the typical dielectric dispersion log operation frequencies (Claverie, 2012; Han et al., 2012; Han and Misra, 2018).

Figure 9A:
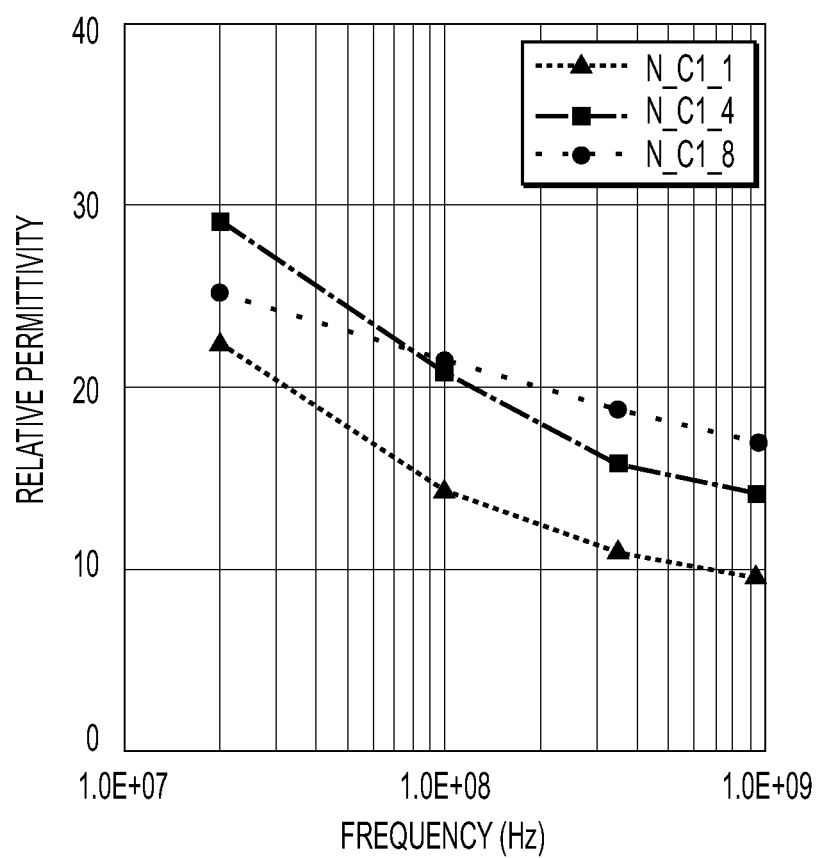
FIG. 9A is a schematic illustration of numerically simulated multi-frequency relative permittivity in three representative 3D pore-scale images from rock types (a) C1 of FIG. 7A.
Figure 9B:
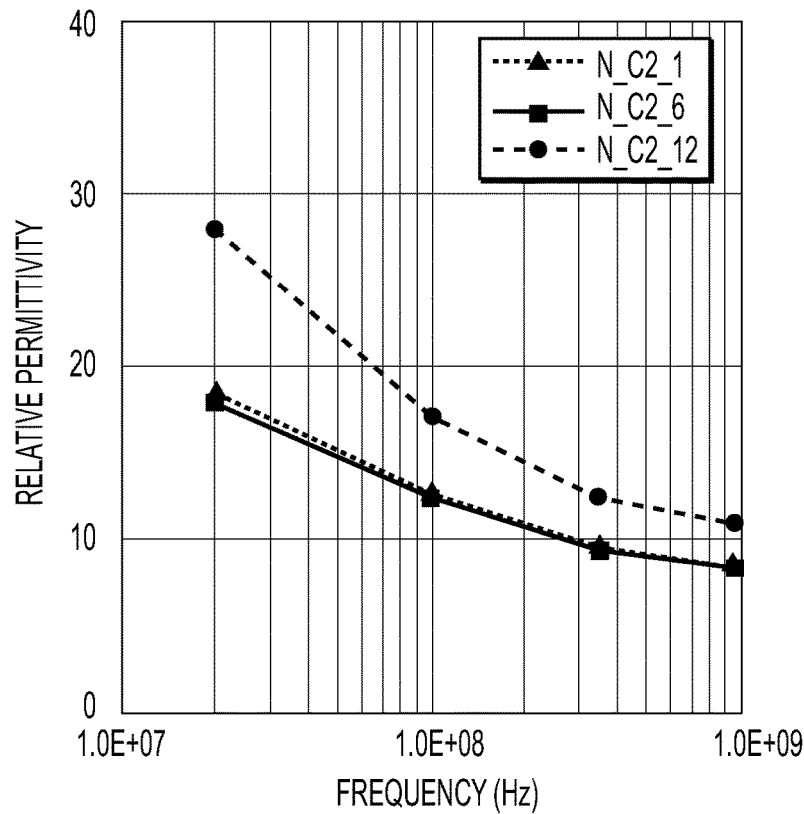
FIG. 9B is a schematic illustration of numerically simulated multi-frequency relative permittivity in three representative 3D pore-scale images from rock types (b) C2 of FIG. 7B.
Figure 10A:
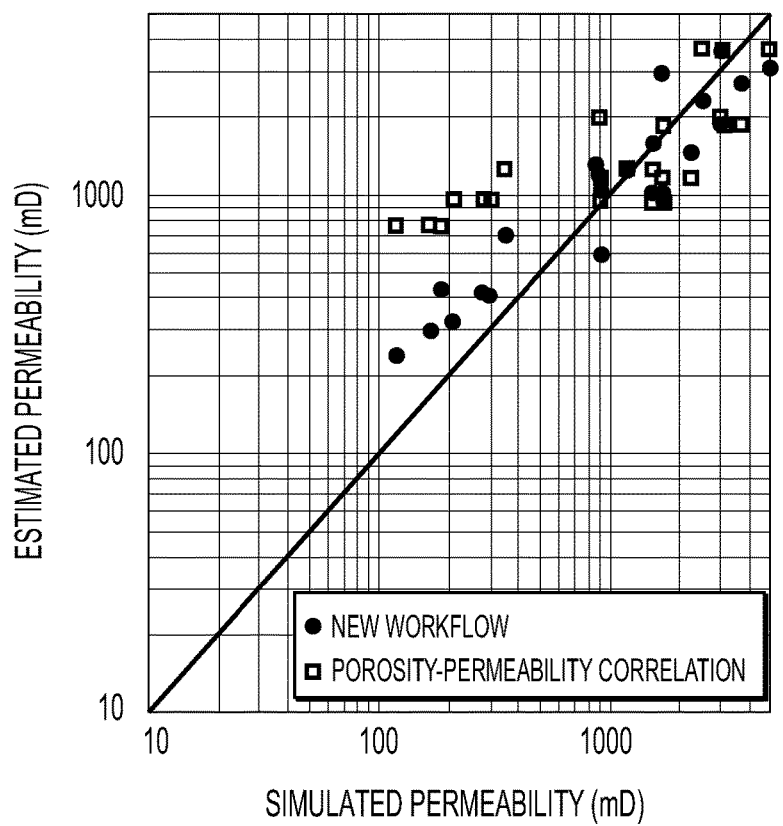
FIG. 10A is a schematic illustration of a comparison for all samples from rock type C1 in the x-, y-, and z-directions.
Figure 10B:
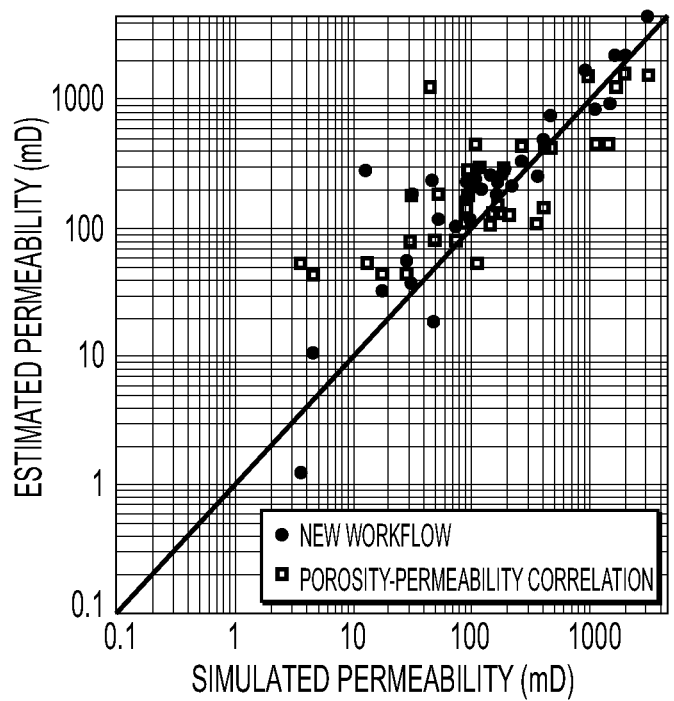
FIG. 10 illustrates a schematic illustration of comparison for all samples from rock typle C2 in the x-, y-, and z-directions.

FIGS. 9a and 9b show the simulated multi-frequency dielectric permittivity for three representative samples of C1 and C2, respectively. All the samples from rock types C1 and C2 present a similar trend for the dielectric permittivity dispersion from 22 to 960 MHz.

The method disclosed herein includes calculating the tortuosity of each subsample through Equation 22, using the total porosity (Tables 1 and 2) and the dielectric permittivity at 960 MHz (FIG. 9) as inputs. the effective pore radius from Equation 21 is calculated, considering the harmonic mean and using the $T_2$ distributions (FIG. 8) as input. The pore structure associated with the pore-scale samples maps a small fraction of the rock and the number of parallel flow pathways is limited. Consequently, the pore space can be approximated by pores of different sizes connected in series. Then, the constriction factor through Equation 23 is calculated, using the conductivity of the rock (Tables 3 and 4) and the brine, the tortuosity, and the connected porosity as inputs. Next, the effective throat radius is calculated using Equation 13, and finally the testing estimates the permeability through Equation 11. Tables 5 and 6 show the calculated parameters for samples from rock types C1 and C2, respectively.

TABLE 5

Pore-scale application: Rock-fabric parameters calculated for subsamples from carbonate C1.

| Sample | $\tau_{eW}$ | $r_P$ (μm) | $C_{Ex}$ | $r_T$ (μm) | $k_{estx}$ (mD) |
|---|---|---|---|---|---|
| N_C1_1 | 1.15 | 14.61 | 11.74 | 4.26 | 239.9 |
| N_C1_2 | 1.14 | 14.32 | 3.32 | 7.86 | 1002.5 |
| N_C1_3 | 1.20 | 19.73 | 2.63 | 12.17 | 2989.6 |
| N_C1_4 | 1.16 | 15.00 | 2.84 | 8.90 | 1889.2 |
| N_C1_5 | 1.17 | 14.06 | 8.97 | 4.69 | 327.6 |
| N_C1_6 | 1.16 | 17.20 | 3.12 | 9.73 | 1598.6 |
| N_C1_7 | 1.17 | 15.31 | 2.80 | 9.15 | 1467.9 |
| N_C1_8 | 1.21 | 16.72 | 2.21 | 11.23 | 3567.3 |

TABLE 6

Pore-scale application: Rock-fabric parameters calculated for subsamples from carbonate C2.

| Sample | $\tau_{eW}$ | $r_P$ (μm) | $C_{Ex}$ | $r_T$ (μm) | $k_{estx}$ (mD) |
|---|---|---|---|---|---|
| N_C2_1 | 1.14 | 16.95 | 15.54 | 4.30 | 234.9 |
| N_C2_2 | 1.30 | 23.33 | 39.57 | 3.71 | 233.0 |
| N_C2_3 | 1.09 | 15.62 | 15.98 | 3.91 | 104.4 |
| N_C2_4 | 1.16 | 17.30 | 15.52 | 4.39 | 186.4 |
| N_C2_5 | 1.21 | 17.78 | 14.98 | 4.60 | 283.0 |
| N_C2_6 | 1.13 | 15.68 | 14.17 | 4.17 | 181.8 |
| N_C2_7 | 1.06 | 18.05 | 2630.47 | 0.35 | 1.3 |
| N_C2_8 | 1.12 | 16.88 | 10.58 | 5.19 | 255.1 |
| N_C2_9 | 1.05 | 16.77 | 72.85 | 1.97 | 10.9 |
| N_C2_10 | 1.25 | 25.4 | 6.69 | 9.82 | 1682.3 |
| N_C2_11 | 1.20 | 17.36 | 10.45 | 5.37 | 480.7 |
| N_C2_12 | 1.19 | 17.72 | 5.06 | 7.88 | 855.3 |

Finally, one compares the permeability estimates, presented in Tables 5 and 6, against the actual permeability estimated from numerical simulations of fluid flow, presented in Tables 1 and 2. Furthermore, the testing may include comparing the accuracy of the estimates obtained from the proposed workflow against the permeability estimates from the well-calibrated conventional permeability-porosity correlation described by Equation 3.

The average relative error obtained for all the subsamples is inferior to 45% and 140% in rock types C1 and C2, respectively. This error still occurs due to the underlying assumptions that the hydraulic and electrical tortuosity and constriction factor are approximately equal.

In order to get the best possible result from the conventional permeability-porosity correlation (Equation 3), the testing is configured to optimize the coefficients a' and b' for each data set. In one non-limiting result, the testing obtained a' and b' equal to 5.47 and 2.34 for rock type C1 and 4.96 and 3.45 for rock type C2. These coefficients result in the minimum relative error in permeability estimates obtainable by Equation 3 for each dataset. With these coefficients, the average relative error obtained for all the subsamples is inferior to 140% and 220% in rock types C1 and C2, respectively. The results suggest that the conventional porosity-permeability correlation method results in average relative errors of 211% and 57% higher than the introduced model in rock types C1 and C2. Furthermore, the conventional method requires significant calibration efforts.

Figure 11:
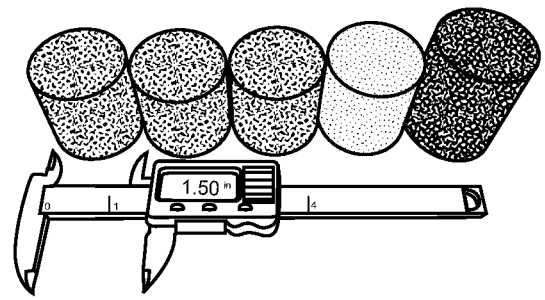
FIG. 11 is a top view of rock samples used for the experimental core-scale verification of the introduced workflow utilizing (left to right) Texas Cream limestone, one core sample from Estaillades limestone, and one core sample from Indiana limestone.

Application to the core-scale domain. The next step consists of validating the proposed workflow for permeability assessment in the core-scale domain. Core samples are selected from different lithofacies from Texas Cream limestone, Indiana limestone, and Estaillades limestone. These samples are selected specifically in order to cover a wide range of permeability values. FIG. 11 shows the core samples selected for the core-scale verification step.

Table 7 lists the values of permeability, porosity, and conductivity for each carbonate rock sample, obtained from core flooding (FIG. 4), NMR, and electrical Impedance spectroscopy (FIG. 6) measurements, respectively.

TABLE 7

Measured data for carbonate rock samples.

| Sample | k (mD) | φ (%) | $\sigma_R$ (S/m) |
| --- | --- | --- | --- |
| E_TC_1 | 5.2 | 26.9 | 0.186 |
| E_TC_2 | 7.5 | 27.1 | 0.173 |
| E_TC_3 | 9.9 | 27.9 | 0.202 |
| E_ES | 43.8 | 23.3 | 0.100 |
| E_IN | 129.5 | 17.6 | 0.089 |

Figure 12:
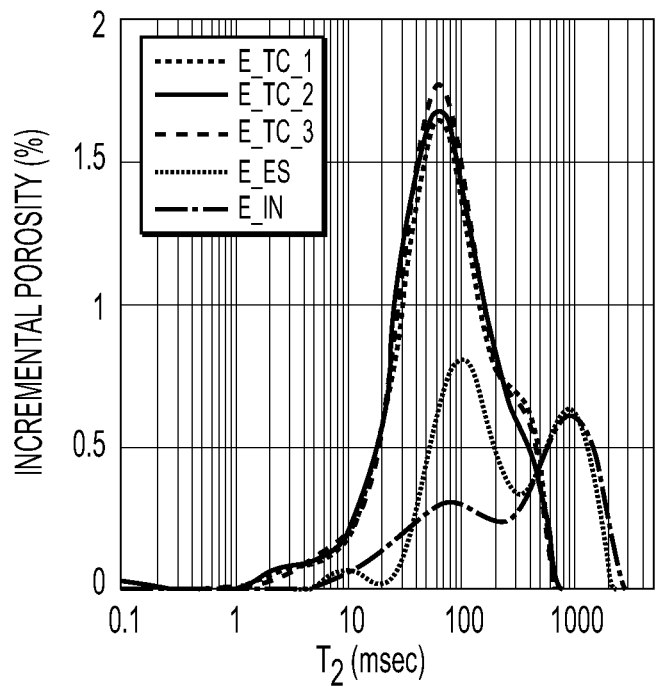
FIG. 12 is an NMR $T_2$ distribution obtained from the interpretation of NMR measurements performed on three core samples from Texas Cream limestone (E_TC_1 to E_TC_3), one core sample from Estaillades limestone (E_ES), and one core sample from Indiana limestone (E_IN).

FIG. 12 illustrates NMR $T_2$ distribution in each carbonate rock sample obtained from the interpretation of NMR measurements.

It is apparent from the $T_2$ distributions presented in FIG. 12 that the core samples from Texas Cream limestone, Estaillades limestone, and Indiana limestone are characterized by multi-modal distributions.

Figure 13:
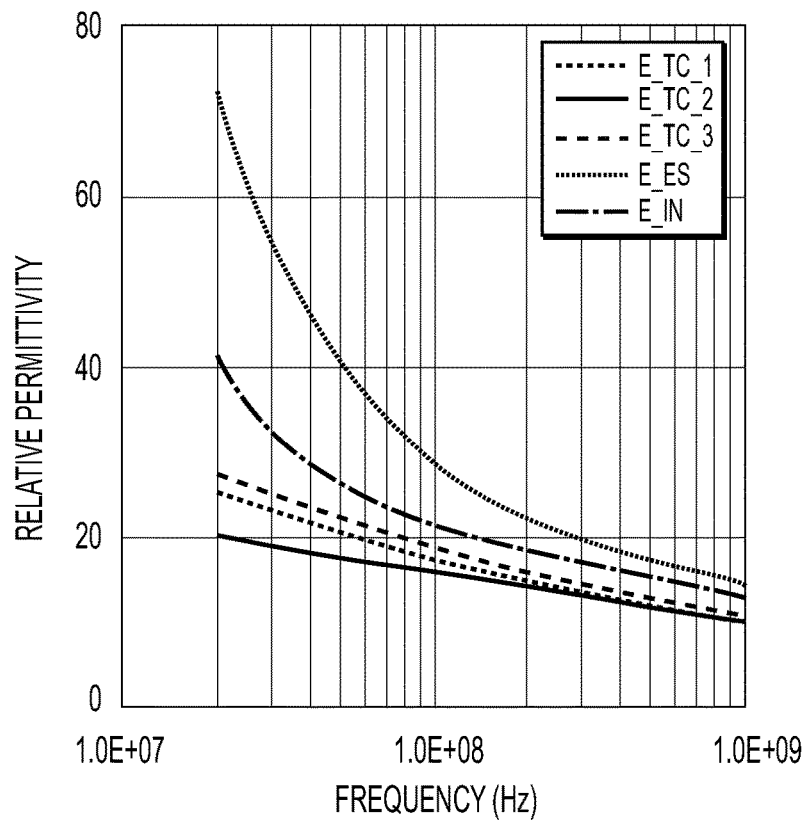
FIG. 13 is a multi-frequency relative permittivity measurements performed on three core samples from Texas Cream limestone, one core sample from Estaillades limestone, and one core sample from Indiana limestone.

FIG. 13 shows the multi-frequency relative permittivity in each carbonate core sample. All the core samples present a similar trend for the dielectric permittivity dispersion in the frequency range from 22 to 960 MHz as the trend observed in the pore-scale simulations (i.e., the dielectric permittivity decreases as the frequency increases).

Next, estimating the pore-throat size distribution through the introduced workflow is completed by integrating NMR, dielectric permittivity, and resistivity measurements as depicted in FIG. 3. The tortuosity is calculated from Equation 22 using the dielectric measurements and the effective pore radius from the $T_2$ distribution through Equation 21. The pore-throat size distribution can be estimated from Equation 13. However, unlike the pore-scale application, we calculate the effective pore radius by considering the geometric mean in Equation 21. The pore structure associated with the core samples maps a larger fraction of the formation as compared to the pore scale samples. Therefore, there is a higher number of parallel flow pathways in the core-scale than in the pore-scale domain. Consequently, the pore space of the core samples can be approximated by a combination of pores of different sizes connected in series and parallel (FIG. 2c).

Figure 14:
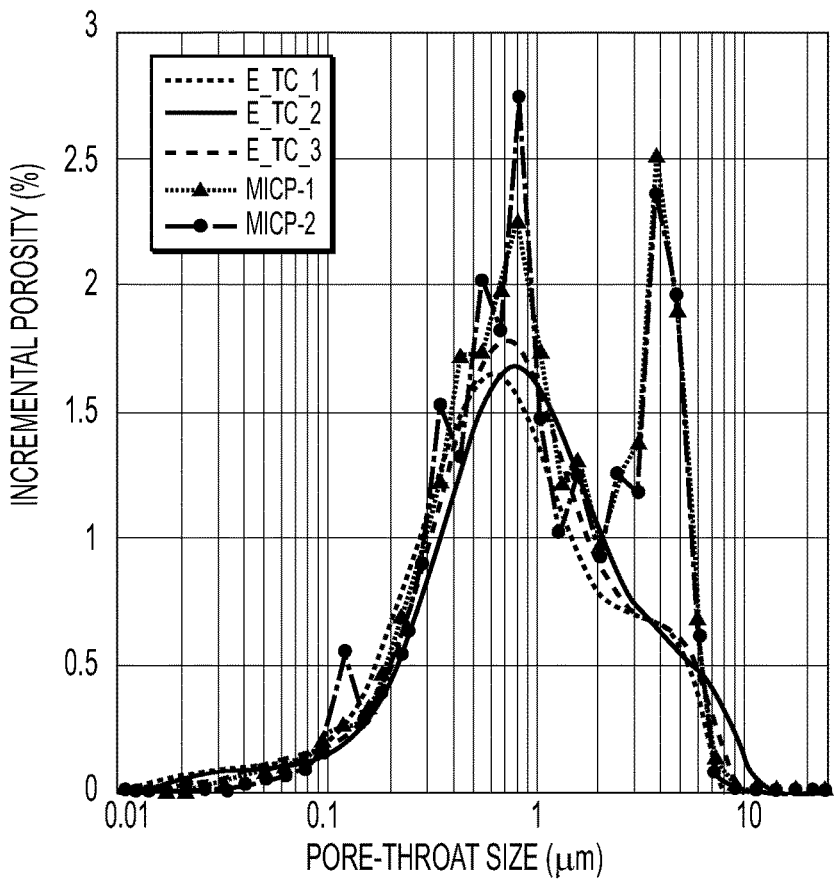
FIG. 14 is a comparison of pore-throat-size distribution of three Texas Cream limestone samples estimated from the proposed workflow (FIG. 3) against that obtained from MICP measurements.

FIG. 14 illustrates the comparison of the pore-throat size distribution of three Texas Cream limestone samples obtained from the proposed workflow against the estimates from two MICP measurements.

FIG. 14 demonstrates that the estimated pore-throat size distribution is in excellent agreement with the results obtained from MICP measurements. Furthermore, all the calculations necessary to accurately estimate the pore-throat-size distributions are performed without calibration. This follows form the fact that the workflow is entirely based on fundamental petrophysical principles. Some simplifying assumption required to develop a calibration-free workflow can lead to some uncertainties. For instance, the small differences observed between the throat-size distribution from the proposed workflow and from MICP measurements in FIG. 14 are mainly due to the assumption that a single contraction factor can be applied to all pore sizes. Adjacent pores with different sizes connected by a throat will necessarily be associated with different constriction factors.

Figure 15:
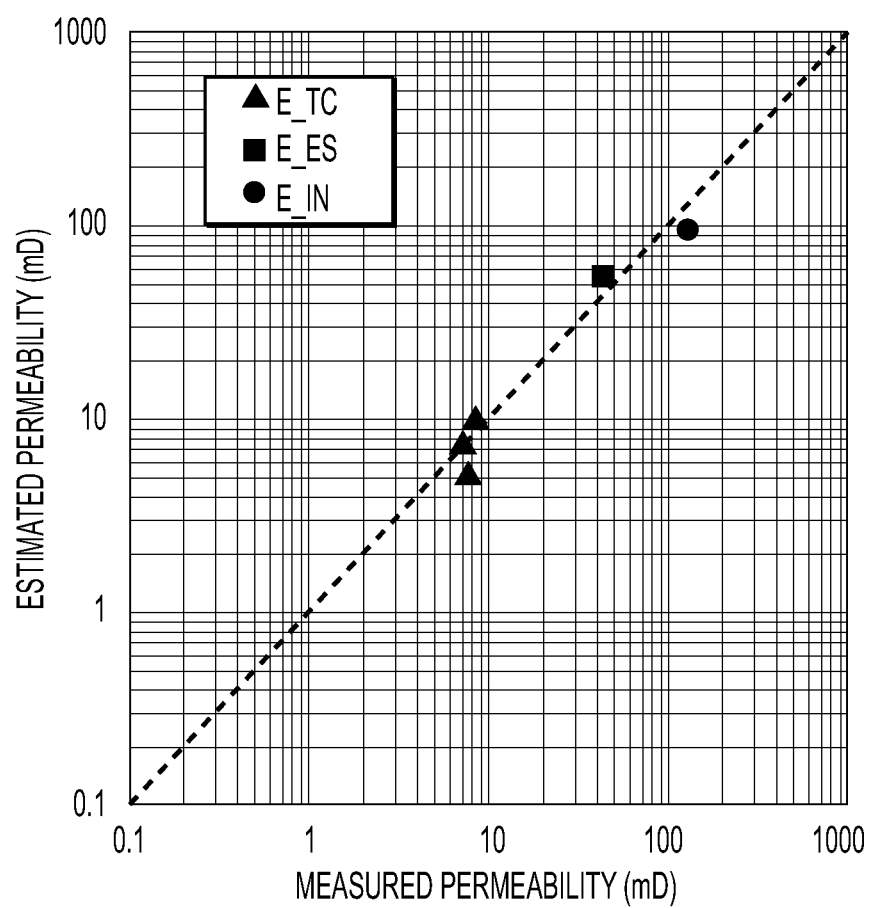
FIG. 15 is a comparison of the permeability estimated from the introduced workflow against the actual permeability measurements for three Texas Cream limestone, one Estaillades, and one Indiana limestone samples.

The main objective, however, is to accurately estimate permeability. FIG. 15 compares the permeability values estimated through Equation 11 against the permeability values measured using the core flood systems illustrated in FIG. 4.

One can observe that the estimated permeability agrees well with the measured permeability for all core samples, with an average relative error of 25%. Finally, Table 8 summarizes all the core-sample parameters.

TABLE 8

Calculated data for Texas Cream limestone

| Sample | $\tau_{eW}$ | $r_P$ (μm) | $C_E$ | $r_T$ (μm) | $k_{est}$ (mD) |
| --- | --- | --- | --- | --- | --- |
| E_TC_1 | 1.37 | 1.04 | 2.464 | 0.663 | 7.8 |
| E_TC_2 | 1.37 | 1.03 | 2.663 | 0.631 | 7.2 |
| E_TC_3 | 1.35 | 1.04 | 2.441 | 0.666 | 8.5 |
| E_ES | 1.08 | 3.76 | 6.395 | 1.486 | 55.1 |
| E_IN | 1.00 | 5.28 | 6.382 | 2.091 | 96.2 |

By introducing an integrated workflow that combines NMR, resistivity, and dielectric measurements to reliably estimate permeability in formations with complex pore structures such as carbonate, the newly introduced workflow also allowed for simultaneous estimation of tortuosity, constriction factor, pore- and throat-size distributions. Furthermore, all the equations considered in the proposed workflow were based on fundamental petrophysical principles. All the results were obtained without any calibration efforts or detection of cutoff values. Consequently, the new integrated workflow can be readily applied to field data if the required measurements are available.

The testing successfully verified the reliability of the introduced workflow in both pore- and core-scale domains using carbonate samples with diverse and complex pore structures. The permeability estimates were compared with pore-scale numerical simulation results and core-scale permeability measurements, respectively. This disclosure presents methods and apparatus for calibrating a model that relates permeability to porosity against all available data-points in the pore-scale domain. Then, comparing average relative error of permeability from the proposed workflow and the permeability-porosity correlation is possible with the testing methods herein. The average relative error obtained by the proposed workflow for all the pore-scale samples of rock types C1 and C2 were inferior to 45% and 140%, while permeability-porosity correlation model provides average relative errors close to 140% and 200%, samples of rock types C1 and C2, respectively. The average relative errors obtained by the proposed workflow were 23%, 26%, and 26% in core-samples from Texas Cream limestone, Estaillades limestone, and Indiana limestone. In sum, the proposed workflow reduced the average relative error in permeability estimates, which is close to 92% for all the samples.

Finally, comparing the pore-throat-size distribution obtained from the proposed workflow against the results obtained from MICP measurements allows for verifying that the estimated distribution was in excellent agreement with the measurements without requiring any calibration, which is a unique outcome of this disclosure The small differences observed were due to the assumption of a constant constriction factor for all pore sizes.

Both the laminar (Darcy) fluid flow and the electric current flux are dominantly described by Laplace's equation. However, the fluid-flow has a no-slip boundary condition at the solid-liquid interface whereas the electric current flux does not. The boundary condition at the solid-fluid interface is of not perpendicular flux at the brine-grain interface for the electric current. Notwithstanding, the proposed workflow does not require any calibration constant and it is entirely based on fundamental petrophysical principles. Therefore, it can be immediately applied to any water-saturated formation for which the required log-scale measurements are available.

APPENDIX A: PORE-SCALE NUMERICAL SIMULATIONS

The data required for the pore-scale verification of the reliability of the introduced workflow is obtained from numerical simulations. The actual permeability of pore-scale images are determined through numerical simulation of fluid flow. Then, numerical simulations of dielectric permittivity, electrical resistivity, and NMR transverse magnetization decay are completed.

Pore-scale permeability assessment. Fluid flow simulations are performed using Palabos (Palabos, 2013), an open source Lattice-Boltzmann Method (LBM) solver. The pressure difference for the fluid flow simulations is set and the method includes calculating the permeability of the porous media, k, using Darcy's law, given by $$U = -\frac{k}{\mu}\frac{p_{inlet} - p_{outlet}}{h}, \quad (A1)$$

where U is the fluid velocity (m/s), $\mu$ is the dynamic viscosity of the fluid (Pa·s), $p_{inlet}$ is the inlet pressure (Pa), $p_{outlet}$ is the outlet pressure (Pa), and h is the height of the voxelized segmented image (m).

Dielectric permittivity. Maxwell's equations couple the electric field with the magnetic flux density and the magnetic field with the displacement current. These couplings complicate the general solution of Maxwell's equations, especially for materials with complex internal structure such as porous media. However, quasi-static approximations can be obtained by neglecting either the magnetic induction or the electric displacement current. The electro-quasi-static approximation is predicated on the presence of relatively slow time-varying fields or sufficiently small dimensions. This condition is mathematically translated by the inequality $$\frac{L_C}{c_{EM}} \ll \tau, \quad (A2)$$

where $L_C$ is a characteristic length of the system, $c_{EM}$ is the velocity of propagation of an electromagnetic wave (speed of light), and r is the characteristic time (i.e., the reciprocal of the angular frequency $\omega$). Therefore, for a representative elementary volume in order of 1 mm or less, quasi-static approximations remain valid at frequencies from 0 Hz to beyond 1 GHz. This condition is usually satisfied in pore-scale simulations.

The continuity equation to be solved for 3D pore-scale images is $$\nabla \cdot J = \nabla - (\sigma E + j\omega\varepsilon_0 \varepsilon E) = 0, \quad (A3)$$

where $\sigma$ is the electrical conductivity, so is the free-space permittivity ($8.854 \times 10^{-12}$ F/m), $\varepsilon$ is relative complex permittivity of a certain linear isotropic material through which the electric field E is applied, $\omega$ is the frequency of oscillation of the electric and magnetic fields, J is the electric current density, and j is the imaginary number ($j^2 = -1$). Both the electrical conductivity and the dielectric permittivity of each voxel can present a dispersive behavior. Furthermore, we consider the influence of the electric double layer at the brine-grain interface using Revil and Florsch (2010) model. Equation A3 is solved through a finite volume approach described by Garcia and Heidari (2016).

Finally, the effective electrical permittivity eff of the porous medium is calculated via $$\varepsilon_{eff} = \frac{\int J dA}{j\omega\varepsilon_0 \Delta\Phi}, \quad (A4)$$

where the integral of the electric current density can be performed at any cross-sectional area (A) perpendicular to the direction of the applied complex electric potential difference A0. Electrical conductivity. Assuming that brine is the only conducting and saturating phase in the rock-fluid system, the techniques described herein calculate the electric potential distribution by solving the differential form of Ohm's Law in conjunction with the continuity equation for electric charges (Garcia and Heidari, 2016) as $$\nabla \cdot J = \nabla \cdot (\sigma \nabla \Phi) = 0, \quad (A5)$$

where $\sigma$ is the electrical conductivity and $\nabla\Phi$ is the electric potential gradient at each numerical grid.

The electrical resistance of the fully-water-saturated pore-scale rock samples, R, can be calculated by $$R = \frac{\Delta\Phi}{\int J dA}, \quad (A6)$$

where J is the electrical current density (A/m$^2$), $\Phi$ is the electric potential (V), and A is the cross-sectional area (m$^2$) of the 3D pore-scale images.

Tortuosity is estimated of the 3D pore-scale rock samples using a streamline tracing algorithm, which is a semi-analytical particle tracking method (Pollock, 1988). The electrical tortuosity, rr, can be approximated by weighted average tortuosity of each streamline with the inverse of the time-of-flight (Zhang and Knackstedt, 1995) as $$\tau_E = \frac{1}{L} \frac{\sum_{i=1}^{n_{sl}} \frac{L_{ei}}{TOF_i}}{\sum_{i=1}^{n_{sl}} \frac{1}{TOF_i}}, \tag{A7}$$

where $n_{sl}$ is the total number of streamlines, L, is the length of each streamline, and $TOF_i$ is the time-of-flight associated with each streamline. Then, comparing the tortuosity estimated from dielectric measurements (Equation 22) with the electrical tortuosity calculated from Equation A7 provides consistent results.

NMR transverse magnetization decay. A random-walk algorithm simulates the NMR response in 3D pore-scale images (Talabi, 2008). The algorithm solves the reaction-diffusion equation proposed by Senturia and Robinson (1970) given by $$\frac{\partial M}{\partial t} = D\nabla^2 M - \frac{M}{T_{2b}} \tag{A8}$$

where M is the total transverse magnetization per unit volume (T/m³). The boundary condition characterizes the magnetization decay due to the interaction of the spins with the surface of the grains via $$D[\nabla M]_{normal} = \mu M \tag{A9}$$

where ρ is the surface relaxivity. Equation A9 describes a rate of magnetization decay proportional to the current transverse magnetization and properties of the fluid and grain. The solution of Equations A8 and A9 is accomplished by simulating particles that move randomly in the pore space. A fixed distance, s, is defined such that the walkers are allowed to move at each time step. Then, the time step is calculated via $$\Delta t = \frac{s^2}{6D}. \tag{A10}$$

The demagnetization of spins associated with each walker occurs when they collide with the surface of the grains. The demagnetization of each spin is represented by removing the corresponding walker from the simulation (i.e., "killing the walker"). The killing probability, δ, of the walkers after each collision is given by $$\delta = \frac{2\rho s}{3D} \tag{A11}$$

Then, the normalized magnetization per unit volume can be calculated at each time step as $$\frac{N_T}{N_0} \propto \frac{M(t)}{M_0} \tag{A12}$$

where $N_T$ is the total number of walkers alive at each time step, $N_0$ is the initial number of walkers, and $M_0$ is the transverse magnetization per unit volume at the initial time. Finally, we developed an algorithm based on a curvature-smoothing regularization algorithm (Chen et al., 1999; Talabi, 2008) to estimate the $T_2$ distribution from the transverse magnetization decay.

APPENDIX B: SIMPLIFIED WORKFLOW WITHOUT DIELECTRIC MEASUREMENTS

The interpretation of dielectric permittivity plays a secondary role in the introduced workflow. However, it is not possible to estimate the pore-throat size distribution without incorporating the dielectric measurements. The pore-throat size is an important parameter for quality control of the permeability estimates and hence the complete workflow is preferred when all the measurements are available. Furthermore, other petrophysical properties, such as fractional flow, can be quantified from the pore-throat-size distribution.

In cases where dielectric permittivity measurements are not available, we can directly calculate the product $C_E \tau_E$ from Equation 23 and apply it to Equation 18. In that case, Equation 16 can be rewritten as $$k = \frac{\langle r_P^2 \rangle_{HM}}{8} \frac{\sigma_R}{\sigma_w} \tag{B1}$$

which becomes equivalent to Equation 8 if we assume that $\Lambda^2$ is equal to $\langle r^2_P \rangle_{HM}$. The most important difference between the workflows associated with Equations 8 and B1 lies in the fact that all the inputs to Equation B1 can be directly calculated from well-log measurements without any calibration effort.

Acronyms

3D Three-Dimensional
AM Arithmetic Mean
CPMG Carr, Purcell, Meiboom and Gill
CT Computed Tomography
EIS Electrical Impedance Spectroscopy
GM Geometric Mean
HM Harmonic Mean
HPC High Performance Computing
LBM Lattice-Boltzmann Method
MFIA Multi-Frequency Impedance Analyzer
MICP Mercury Injection Capillary Pressure
NMR Nuclear Magnetic Resonance
SIP Spectral Induced Polarization
SM Statistical Mean
SNR Signal-to-Noise Ratio
TACC Texas Advanced Computing Center Nomenclature a Calibration constant
a' Calibration constant
A Cross-sectional area, m²
$A_P$ Cross-sectional area of the pore, m²
$A_T$ Cross-sectional area of the throat, m²
b Calibration constant
b' Calibration constant
c Calibration constant $C_{EM}$ Velocity of propagation of an electromagnetic wave, m/s
$C_E$ Electrical constriction factor
$C_H$ Hydraulic constriction factor
D Molecular diffusion coefficient, m²/s
E Electric field, V/m
F Formation factor
$F_C$ Capacitative formation factor
G Magnetic gradient strength, T/m
h Height, m
j Imaginary number
J Electric current density, A/m²
k Permeability, mD
$k_{est}$ Estimated permeability, mD
$l_c$ Characteristic length of pore space, m
L Length, m
$L_C$ Characteristic length, m
$L_e$ Tortuous length of pore channels, m
$L_{ei}$ Length of streamline, m
M Total transverse magnetization per unit volume, T/m³
$M_0$ Transverse magnetization per unit volume at the initial time, T/m³
$n_{sl}$ Total number of streamlines
$N_0$ Initial number of walkers
$N_T$ Total number of walkers alive at each time step
$p_{inlet}$ Inlet pressure, Pa
$p_{outlet}$ Outlet pressure, Pa
$r_H$ Hydraulic radius, m
$r_P$ Pore radius, m
$r_{P,eff}$ Effective pore radius, m
$r_T$ Throat radius, m
R Electrical resistance of the fully-water-saturated pore-scale rock samples, Ω
s Fixed distance that walkers are allowed to move at each time step, m
S Total surface of the pores in contact with the fluid, m²
$S_{wi}$ Irreducible water saturation
t Time, s
$T_2$ Relaxation time of transverse magnetization, s
$T_{2b}$ Bulk relaxation time, s
$T_E$ Time between spin echoes, s
$TOF_i$ Time-of-flight, s
U Fluid velocity, m/s
V Total volume of the pores containing the fluid, m³
$x_i$ Volume fraction
γ Gyromagnetic ratio of the proton, rads/T
δ Killing probability of walkers
Δt Time step, s
ΔΦ Electric potential difference, V
ε Relative complex permittivity, F/m
$ε_0$ Free-space permittivity, F/m
$ε_{eff}$ Effective electrical permittivity, F/m
$ε_f$ Relative dielectric permittivity of the fluid
$ε_R$ Relative dielectric permittivity of the rock
Λ Parameter characteristic of the geometry of the porous medium
μ Dynamic viscosity of the fluid, Pa·s
ρ Surface relaxivity of the pores, m/s
σ Electrical conductivity, S/m
$σ_R$ Electrical conductivity of the brine saturated rock, S/m
$σ_w$ Brine conductivity, S/m
τ Characteristic time, s
$τ_E$ Electrical tortuosity
$τ_{eW}$ Dielectric tortuosity
$τ_H$ Hydraulic tortuosity
ϕ Porosity
$ϕ_c$ Connected porosity
$ϕ_T$ Total porosity
Φ Electric potential, V
∇Φ Electric potential gradient
ω Angular frequency, rad/s

REFERENCES

Archie, G. E., 1942, The electrical resistivity log as an aid in determining some reservoir characteristics: *Transactions of the AIME*, 146(01), pp. 54-62, doi:10.2118/942054-G.

Avellaneda, M. and Torquato, S., 1991, Rigorous link between fluid permeability, electrical conductivity, and relaxation times for transport in porous media: *Physics of Fluids A: Fluid Dynamics*, 3(11), pp. 2529-2540, doi:10.1063/1.858194.

Berg, C. F., 2012, Re-examining Archie's law: conductance description by tortuosity and constriction: *Physical Review E*, 86(4), p. 046314, doi:10.1103/PhysRevE.86.046314.

Berg, C. F., 2014, Permeability description by characteristic length, tortuosity, constriction and porosity: *Transport in Porous Media*, 103(3), pp. 381-400, doi:10.1007/s11242-014-0307-6.

Bernabé, Y. and Revil, A., 1995, Pore-scale heterogeneity, energy dissipation and the transport properties of rocks: *Geophysical Research Letters*, 22(12), pp. 1529-1532, doi:10.1029/95g01418.

Bitterlich, V. W. and Wobking, H., 1970, Eine method zur direkten bestimmung der sogenannten "geometrischen tortuosit" (A method for the direct determination of geometrical tortuosity): *Zeitschift Für Geophysik*, 36, pp. 607-620.

Bloembergen, N., Purcell, E. M., and Pound, R. V., 1948, Relaxation effects in nuclear magnetic resonance absorption: *Physical Review*, 73(7), pp. 679-712, doi:10.1103/PhysRev.73.679.

Carman, P. C., 1937, Fluid flow through granular beds: *Trans. Inst. Chem. Eng.*, 15, pp. 150-166.

Chen, S., Georgi, D., Fang, S., Salyer, J., and Shorey, D., 1999, Optimization of NMR logging acquisition and processing: SPE Annual Technical Conference and Exhibition, Houston, Tex., USA, October 3-6, doi:10.2118/56766-ms.

Claverie, M., 2012, Dielectric scanner multifrequency dielectric dispersion service: Schlumberger. Clennell, M. B., 1997, Tortuosity: a guide through the maze: *Geological Society, London, Special Publications*, 122(1), pp. 299-344, doi:10.1144/gsl.sp.1997.122.01.18.

Coates, G. R., and Dumanoir, J. L, 1974, A new approach to improved log-derived permeability: *The Log Analyst*, 15(1), pp. 17-31.

Coates, G. R., Xiao, L, and Prammer, M. G., 1999, NMR logging: principles and applications: Vol. 344, Haliburton Energy Services, Houston, Tex., USA.

Dong, H., 2007, Micro-CT imaging and pore network extraction: PhD dissertation, Imperial College London, UK.

Garcia, A. P. and Heidari, Z., 2016, Quantification of directional pore network connectivity and rock fabric and its application in enhanced assessment of hydrocarbon reserves: SPE Annual Technical Conference and Exhibition, Dubai, UAE, September 26-28, doi:10.2118/181571-ms.

Han, M., Cuadros, J., Suarez, C. A. P., Decoster, E., Falvre, O., Mosse, L., and Seleznev, N., 2012, Continous estimate of cation exchange capacity from log data: a new approach based on dielectric dispersion analysis: SPWLA 53rd Annual Logging Symposium, Cartagena, Colombia, June 16-20. Han, Y., and Misra, S., 2018, Bakken petroleum system characterization using dielectric-dispersion logs: *Petrophysics*, 59(2), pp. 201-217.

Johnson, D. L, Koplik, J. and Schwartz, L M., 1986, New pore-size parameter characterizing transport in porous media: *Physical Review Letters*, 57(20), pp. 2564-2567, doi:10.1103/physrevlett.57. 2564.

Katz, A. J. and Thompson, A. H., 1987, Prediction of rock electrical conductivity from mercury injection measurements: *Journal of Geophysical Research*, 92(B1), pp. 599-H07, doi:10.1029/jb092ib 01p00599.

Kozeny, J., 1927, Uber kapillare leitung der wasser in boden: RoyalAcademy of *Science, Vienna, Proc. Class* 1, 136, pp. 271-306.

Nelson, P. H., 1994, Permeability-porosity relationships in sedimentary rocks: *The Log Analyst*, 35(3), pp. 38-62.

Osterman, G., Keating, K., Slater, L., and Binley, A., 2015, Comparison and improvement of laboratory SIP and NMR models of permeability: *85th SEG Annual International Meeting*, SEG Technical Program Expanded Abstracts, pp. 5005-5010, doi:10.1190/segam2015-5906134.1. Oyewole, E., Garcia, A. P., and Heidari, Z., 2016, A new method for assessment of directional permeability and conducting pore network using electric conductance in porous media: SPWLA 57th Annual Logging Symposium, Reyjavik, Iceland, June 25-29.

Pala bos. 2013. *The Palabos Software Project*, http://www-.palabos.org/documentation/tutorial/permeability.html.

Peters, E. J., 2012, Advanced petrophysics: geology, porosity, absolute permeability, heterogeneity, and geostatistics: Vol. 1, Greenleaf Book Group.

Pollock, D. W., 1988, Semianalytical computation of path lines for finite-difference models: *Ground Water*, 26(6), pp. 743-750, doi:10.1111/j.1745-6584.1988.tb 00425.x.

Purba, S. A., Garcia, A. P., and Heidari, Z., 2017, New method for rock classification in carbonate formations using well-log-based rock fabric quantification: SPWLA 58th Annual Logging Symposium, Oklahoma City, Okla., USA, June 17-21.

Revil, A. and Cathles, L M., 1999, Permeability of shaly sands: *Water Resources Research*, 35(3), pp. 651-662, doi:10.1029/98wr02700.

Revil, A. and Florsch, N., 2010, Determination of permeability from spectral induced polarization in granular media: *Geophysical Journal Interpretation*, 181(3), pp. 1480-1498, doi:10.1111/j.1365-246x. 2010.04573.x.

Schindelin, J., Arganda-Carreras, I., Frise, E. et al., 2012, Fiji: an open-source platform for biological-image analysis: *Nature Methods*, 9(7), pp. 676-682, doi:10.1038/nmeth.2019.

Senturia, S. D. and Robinson, J. D., 1970, Nuclear spin-lattice relaxation of liquids confined in porous solids: *Society of Petroleum Engineers Journal*, 10(03), pp. 237-244, doi:10.2118/2870-pa.

Stogryn, A., 1971, Equations for calculating the dielectric constant of saline water (correspondence): *IEEE Transactions on Microwave Theory and Techniques*, 19(8), pp. 733-736, doi:10.1109/tmtt. 1971.1127617.

Talabi, O. A., 2008, Pore-scale simulation of NMR response in porous media: PhD Dissertation, Imperial College London, UK.

Timur, A., 1968, An investigation of permeability, porosity, and residual water saturation relationships for sandstone reservoirs: SPWLA 9th Annual Logging Symposium, New Orleans, Louisiana, USA.

Tixier, M. P, 1949, Evaluation of permeability from electric-log resistivity gradients: *Oil & Gas Journal*, 16, pp. 113-133.

Weller, A., Nordsiek, S., and Debschiitz, W., 2010, Estimating permeability of sandstone samples by nuclear magnetic resonance and spectral-induced polarization: *Geophysics*, 75(6), pp. E215-E226, doi:10.1190/1.3507304.

Wyllie, M. R J. and Rose, W. D., 1950, Some theoretical considerations related to the quantitative evaluation of the physical characteristics of reservoir rock from electrical log data: *Journal of Petroleum Technology*, 2(04), pp. 105-118, doi:10.2118/950105-g.

Wyllie, M. R J. and Spangler, M. B., 1952, Application of electrical resistivity measurements to problem of fluid in porous media: *AAPG Bulletin*, 36(2), pp. 359-403, doi: 10.1306/3d934403-16b1-11d7-8645000102c 1865d.

Zhang, X. and Knackstedt, M. A., 1995, Direct simulation of electrical and hydraulic tortuosity in porous solids: *Geophysical Research Letters*, 22(17), pp. 2333-2336, doi: 10.1029/95GL02230.

Ziarani, A. S. and Aguilera, R., 2012, Pore-throat radius and tortuosity estimation from formation resistivity data for tight-gas sandstone reservoirs: *Journal of Applied Geophysics*, 83, pp. 65-73, doi:10.1016/j.Jappgeo. 2012.05.008.

The invention claimed is:

1. A computerized system for estimating pore-throat-size distribution in a section of porous media, comprising:
at least one computer comprising a processor and computerized memory;
an imaging device configured to collect nuclear magnetic resonance (NMR) data pertaining to the section of porous media and transmitting the NMR data to the memory;
a holder configured for attaching the section of porous media between an anode and a cathode;
a voltage source connected to the anode;
an impedance analysis circuit connected to the cathode and receiving current through the section of porous media,
wherein the impedance analysis circuit transmits at least one of impedance data and dielectric permittivity data regarding the current to the computer, and
wherein the processor calculates an effective pore-throat size from the NMR data, the impedance data, and the permittivity data,
wherein the processor is further configured for:
storing, in the computerized memory, measurements performed on the section of the porous media, wherein the measurements comprise (i) the nuclear magnetic resonance (NMR) data comprising transverse magnetization decay values ($T_2$), (ii) the dielectric permittivity data, and (iii) the impedance data; and
using the processor to implement software stored in the computerized memory, wherein the software is configured to independently calculate the effective pore-throat size from rock fabric parameters, comprising (a) electric tortuosity ($\tau_E$) calculated from the dielectric permittivity and the NMR data which correlates to hydraulic tortuosity ($\tau_H$), (b) an electrical constriction factor ($C_E$) calculated from the measurements (i)-(iii) which correlates to hydraulic constriction factor ($C_H$), and (c) pore-size distribution ($r_P$) and effective pore radii ($\langle r_P \rangle$) calculated from the NMR data;

wherein the software is further configured to calculate the pore-throat-size distribution ($r_T$) according to the formula:

$$r_T = \frac{r_P}{\sqrt{C_H}}.$$

2. A computerized system according to claim 1, wherein the electrical constriction factor CE is calculated according to the formula:

$$C_E = \frac{\phi_c}{\tau_E^2} \frac{\sigma_w}{\sigma_R}$$

wherein $C_E$ correlates to $C_H$, $\sigma_F$ is the electrical conductivity of the section of the brine-saturated porous media, $\sigma_w$ is the conductivity of the brine, $\phi_c$ is a connected porosity, and $\tau_E$ is an electrical tortuosity which correlates to a dielectric tortuosity and a hydraulic tortuosity.

3. A computerized system of estimating effective pore-throat size according to claim 1, wherein an effective pore-throat radius is calculated according to the formula:

$$\langle r_T \rangle = \sqrt{\langle r_T^2 \rangle_{SM}} = \frac{\sqrt{\langle r_P^2 \rangle_{SM}}}{\sqrt{C_H}},$$

wherein SM is a statistical mean operator.

4. A computerized system according to claim 1, wherein an effective pore-throat radius is calculated from the $T_2$ distribution of the porous media fully saturated with a single fluid according to the formula:

$$\langle r_P \rangle = \sqrt{\langle r_P^2 \rangle_{SM}} = \sqrt{\left\langle \left[\frac{3\rho T_{2b} T_2}{T_{2b} - T_2}\right]^2 \right\rangle_{SM}}$$

wherein $T_{2b}$ is the bulk relaxation time of the fluid and $\rho$ is the surface relaxivity of the pores wherein SM is a statistical mean operator.

5. A computerized system according to claim 4, wherein the porous media is partially saturated with water, and the $T_2$ distribution of the brine-saturated porous media is inferred from the measurements (i)-(iii).

6. A computerized method according to claim 1, wherein the dielectric tortuosity is calculated from the dielectric permittivity of the porous media using the formula:

$$\tau_{eW} = \sqrt{\phi_T F_C} = \sqrt{\phi_T \frac{\varepsilon_f}{\varepsilon_R}}$$

wherein $F_c$ is a capacitive formation factor, $\varepsilon_f$ is the relative dielectric permittivity of the fluid, $\varepsilon_R$ is the relative dielectric permittivity of the rock, $\phi_T$ is the total porosity, and $\tau_{eW}$ corresponds to the dielectric tortuosity which correlates to the hydraulic and electrical tortuosities.

7. A computerized system according to claim 1, wherein the correlations between connected and effective porosity to total porosity are estimated from three-dimensional pore-scale images of the section of the porous media, and wherein the connected porosity of the porous media is calculated by a connected component labeling algorithm.

8. A computerized system for estimating pore-throat-size distribution in the section of porous media, comprising:

at least one computer comprising a processor and computer readable memory;

an imaging device configured to collect nuclear magnetic resonance (NMR) data pertaining to the section of porous media and transmitting the NMR data to the memory;

a holder comprising opposite attachment points configured to connect to opposite ends of the section of porous media, wherein the opposite attachment points are further configured to provide, simultaneously, current flow and fluid flow through the attachment points in at least one electrical circuit and at least one fluid circuit;

an anode connected to one of the attachment points and a cathode connected to another the other attachment point, defining an electrical circuit connected to the holder;

a pressure regulating assembly connected to the cathode;

a voltage source connected to the anode;

an impedance analysis circuit connected to the cathode and receiving current through the section of porous media, wherein the impedance analysis circuit transmits at least one of impedance data and permittivity data regarding the current to the computer, and wherein the processor calculates an effective pore-throat size from the NMR data, the impedance data, and the permittivity data;

wherein the processor is configured with software to estimate directional permeability (k) of a section of the porous media that is either fully or partially saturated with water by implementing a method of:

storing, in the memory, measurements performed on the section of the porous media, wherein the measurements comprise (i) the nuclear magnetic resonance (NMR) data comprising transverse magnetization decay values ($T_2$), (ii) the permittivity data; and (iii) at least one directional electrical conductivity measurement ($\sigma_P$);

using the processor to implement software stored in the memory, wherein the software is configured to calculate the directional permeability from fabric parameters comprising (a) electric tortuosity ($\tau_E$) calculated from the permittivity data and the NMR data which correlates to hydraulic tortuosity ($\tau_H$), (b) an electrical constriction factor ($C_E$) from the measurements (i)-(iii) which correlates to hydraulic constriction factor ($C_H$), and (c) pore-size distribution ($r_P$) and effective pore radii calculated from the NMR data, and (d) a connected porosity ($\phi_c$) estimated from the NMR data, in porous medias where total pore volume is approximately equal to the connected pore volume or estimated from NMR data displayed as three-dimensional pore-scale images of the section of the porous media, and wherein the connected porosity of the porous media is calculated by a connected component labeling algorithm in porous medias where total pore volume is greater than the connected pore volume;

wherein the software is further configured to calculate a statistical mean of directional permeability of the section of the porous media using the formula:

$$\langle k \rangle_{SM} = \frac{\phi_c}{8 C_H \tau_H^2} \langle r_P^2 \rangle_{SM},$$

wherein SM is a statistical mean operator.

9. A computerized system of estimating directional permeability of the section of a porous media according to claim 8, wherein the directional permeability is determined in a same direction as dielectric permittivity and impedance measurements for the porous media.

10. A computerized system of estimating directional permeability of the section of a porous media according to claim 8, according to the formula:

$$k = \frac{\langle r_P^2 \rangle_{SM}}{8} \frac{\sigma_R}{\sigma_w},$$

wherein $\sigma_r$ is an electrical conductivity of the section of the porous media fully saturated with brine and $\sigma_w$ is conductivity of the brine.

11. A computerized system of estimating directional permeability of the section of porous media according to claim 10, wherein the porous media is partially saturated with the brine, and the conductivity of a brine saturated section of porous media can be inferred from conductivity measurements of the partially brine saturated rock.

12. A computerized system of estimating directional permeability of the section of a porous media according to claim 11, wherein a statistical mean of a distribution of the pore radius squared is a harmonic mean, in the pore-scale domain, and the effective pore radius is calculated from the $T_2$ distribution of the porous media fully saturated with a single fluid according to the formula:

$$\langle r_P \rangle = \sqrt{\langle r_P^2 \rangle_{SM}} = \sqrt{\left\langle \left[ \frac{3 \rho T_{2b} T_2}{T_{2b} - T_2} \right]^2 \right\rangle_{SM}}$$

wherein $T_{2b}$ is a bulk relaxation time of the fluid and $\rho$ is a surface relaxivity of the pores, wherein SM is a statistical mean operator.

13. A computerized system of estimating directional permeability of the section of a porous media according to claim 12, wherein a statistical mean of a distribution of the pore radius squared is a geometric mean, in the core-scale domain, and the effective pore radius is calculated from the $T_2$ distribution of the porous media saturated with a single fluid according to the formula:

$$\langle r_P \rangle = \sqrt{\langle r_P^2 \rangle_{SM}} = \sqrt{\left\langle \left[ \frac{3 \rho T_{2b} T_2}{T_{2b} - T_2} \right]^2 \right\rangle_{SM}}$$

wherein $T_{2b}$ is the bulk relaxation time of the fluid and $\rho$ is the surface relaxivity of the pores, wherein SM is a statistical mean operator.

14. A computerized system of estimating directional permeability of a section of a porous media according to claim 13, wherein the correlations between connected and effective porosity to total porosity are estimated from three-dimensional pore-scale images of the section of the porous media, and wherein the connected porosity of the porous media is calculated by a connected component labeling algorithm.

15. A computerized system of estimating directional permeability of a section of a porous media according to claim 14, wherein a connected porosity is estimated as being equal to total porosity of the porous media.

16. A computerized system of estimating directional permeability of a section of a porous media according to claim 15, wherein dielectric tortuosity is calculated from the dielectric permittivity of the porous media using the formula:

$$\tau_{eW} = \sqrt{\phi_T F_C} = \sqrt{\phi_T \frac{\varepsilon_f}{\varepsilon_R}}$$

wherein $F_c$ is a capacitive formation factor, $\varepsilon_f$ is the relative dielectric permittivity of the brine, $\varepsilon_R$ is the relative dielectric permittivity of the porous media, $\phi_T$ is a total porosity, and $\tau_{eW}$ corresponds to the dielectric tortuosity which correlates to the hydraulic and electric tortuosities and the dielectric tortuosity is determined in a same direction as dielectric permittivity measurements for a porous media.

17. A system of estimating directional permeability of a section of a porous media according to claim 8, wherein the electrical constriction factor is calculated according to the formula:

$$C_E = \frac{\phi_c}{\tau_E^2} \frac{\sigma_w}{\sigma_R}$$

where $C_E$ is the electrical constriction factor which correlates to $C_H$, $\phi_c$ is the connected porosity, and $\tau_E$ is the electrical tortuosity which correlates to the dielectric and hydraulic tortuosities.

* * * * *

UNITED STATES PATENT AND TRADEMARK OFFICE
CERTIFICATE OF CORRECTION

| | |
|---|---|
| PATENT NO. | : 12,025,576 B2 |
| APPLICATION NO. | : 15/734047 |
| DATED | : July 2, 2024 |
| INVENTOR(S) | : Zoya Heidari, Artur Posenato Garcia and Yifu Han |

It is certified that error appears in the above-identified patent and that said Letters Patent is hereby corrected as shown below:

In the Claims

In Claim 2, Column 29, Line 10, delete "CE" and insert -- $C_E$ --,
In Claim 2, Column 29, Line 18, delete "$\sigma_F$" and insert -- $\sigma_R$ --,
In Claim 9, Column 30, Line 48, delete "($\sigma_P$);" and insert -- ($\sigma_R$); --,
In Claim 12, Column 31, Line 26, delete "$\sigma_r$" and insert -- $\sigma_R$ --.

Signed and Sealed this
Twenty-fourth Day of June, 2025

Coke Morgan Stewart
*Acting Director of the United States Patent and Trademark Office*